United States Patent
Ko et al.

(10) Patent No.: US 6,689,648 B2
(45) Date of Patent: Feb. 10, 2004

(54) SEMICONDUCTOR DEVICE HAVING SILICON ON INSULATOR AND FABRICATING METHOD THEREFOR

(75) Inventors: Young-Gun Ko, Seoul (KR); Byung-Sun Kim, Suwon (KR); Young-Wug Kim, Suwon (KR)

(73) Assignee: Samsung Electronics Co., Ltd. (KR)

( * ) Notice: Subject to any disclaimer, the term of this patent is extended or adjusted under 35 U.S.C. 154(b) by 179 days.

(21) Appl. No.: 10/134,798

(22) Filed: Apr. 29, 2002

(65) Prior Publication Data

US 2002/0119608 A1 Aug. 29, 2002

Related U.S. Application Data

(62) Division of application No. 09/658,099, filed on Sep. 8, 2000, now Pat. No. 6,407,429.

(30) Foreign Application Priority Data

Oct. 20, 1999 (KR) .......................................... 99-45495

(51) Int. Cl.[7] .............................................. H01L 21/00
(52) U.S. Cl. ...................................... 438/155; 438/170
(58) Field of Search .......................... 257/347; 438/155

(56) References Cited

U.S. PATENT DOCUMENTS

6,303,414 B1 * 10/2001 Ang et al. .................. 438/155
6,406,948 B1 *  6/2002 Jun et al. .................... 438/152

* cited by examiner

*Primary Examiner*—Douglas A. Wille
(74) *Attorney, Agent, or Firm*—Mills & Onello, LLP

(57) ABSTRACT

The present invention relates to an SOI semiconductor device and a method for fabricating an SOI semiconductor device, in which the portions formed with silicide layers are laterally restricted by spacers to a predetermined range in the diffusion regions to be used for diodes or well resistors. In this manner, it is possible to fix the length of distance between the sides of a silicide layer and a diffusion region, greater than that available in the prior art techniques, thereby minimizing power leakage at the sides of the diffusion regions. In the SOI semiconductor device thus constructed, the diffusion regions to be used for diodes (or well resistors) are constructed with spacers in a double junction structure of different density of impurity layers (for instance, a P− or N− layer respectively surrounds a P+ or N+ layer), in other words, only onto a high density of impurity layer, the P+ or N+ layer, or in a single junction structure in which the spacers restrict a range of space for forming the silicide layer in the diffusion region.

23 Claims, 27 Drawing Sheets

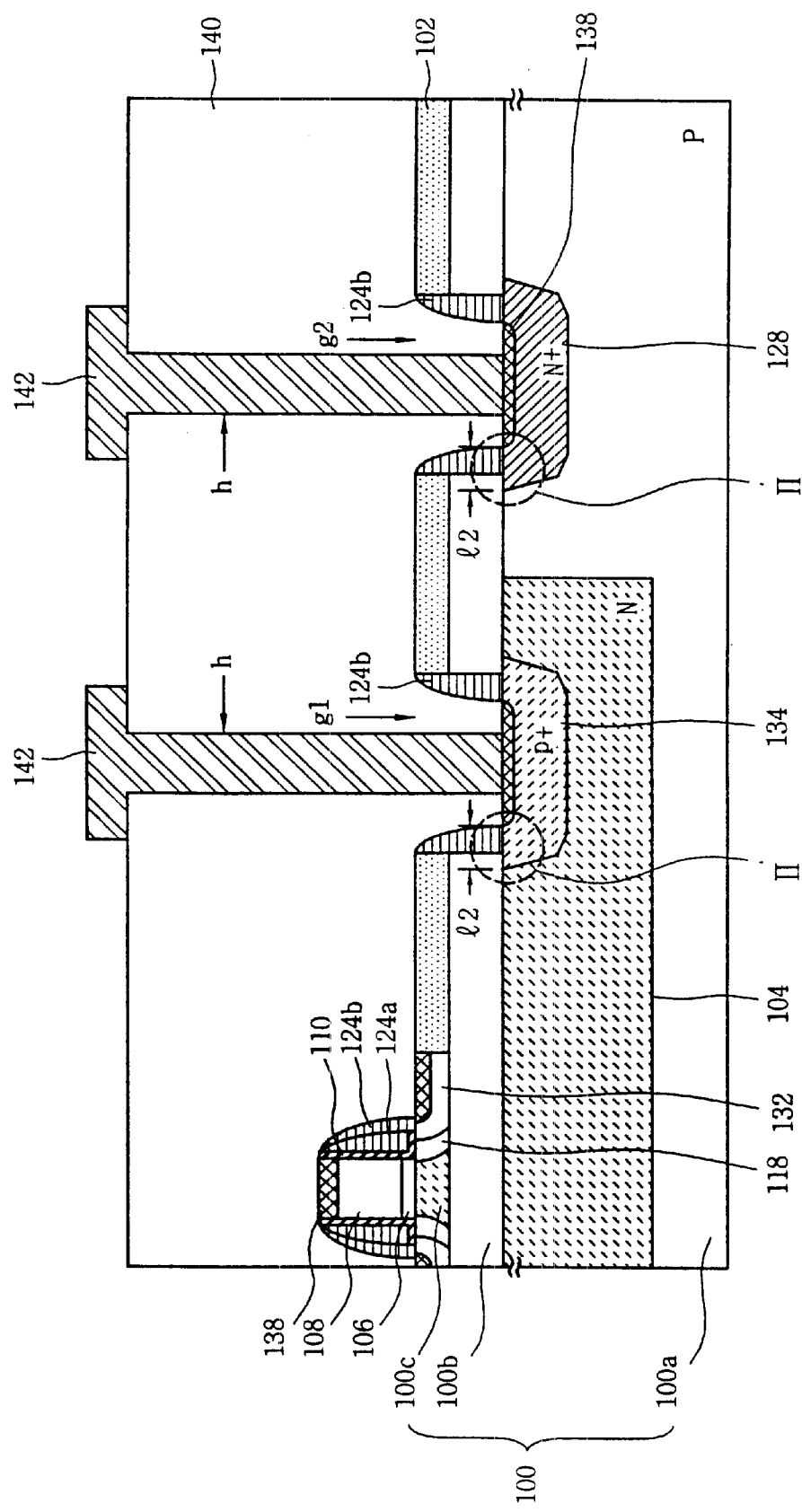

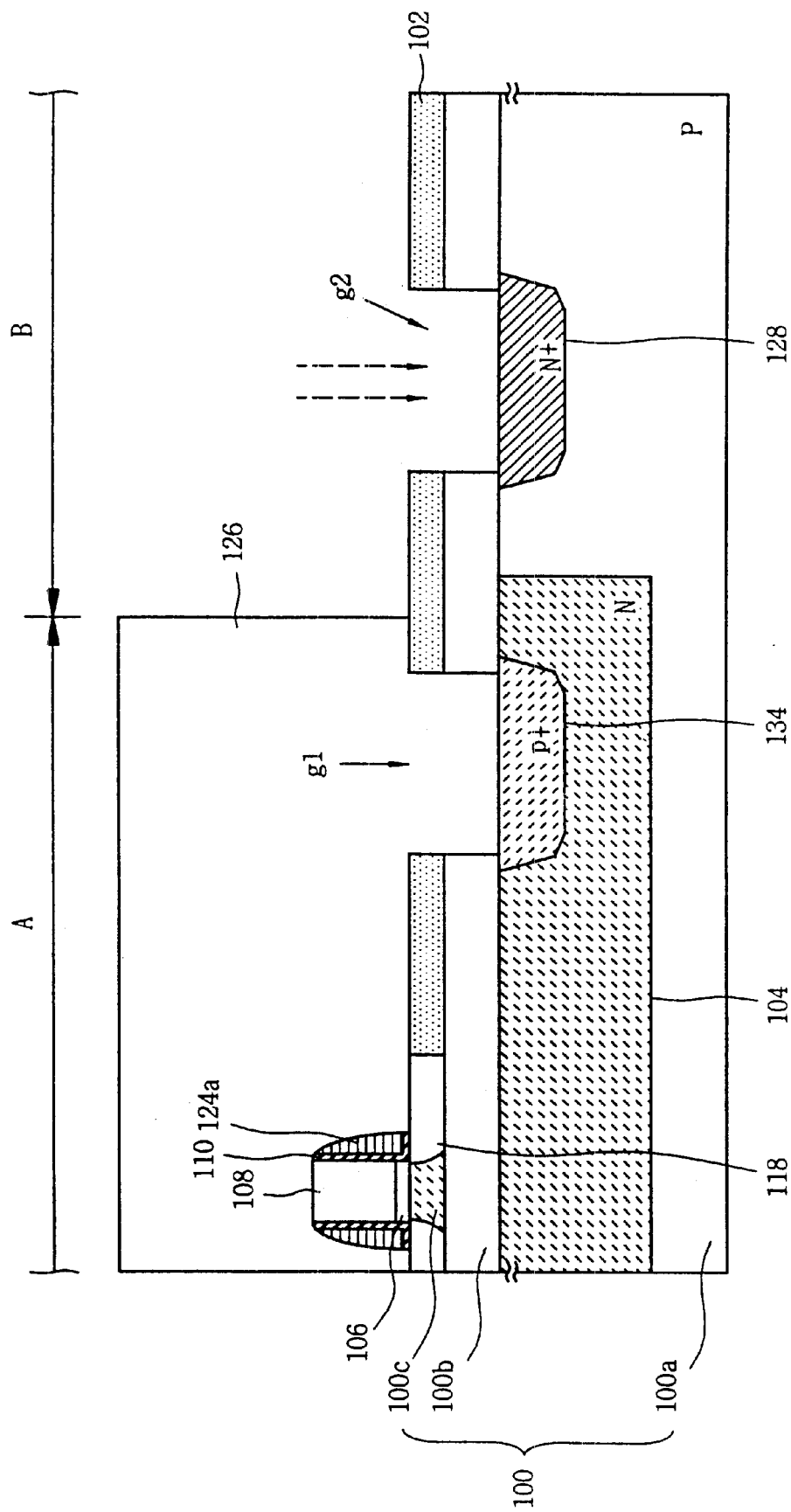

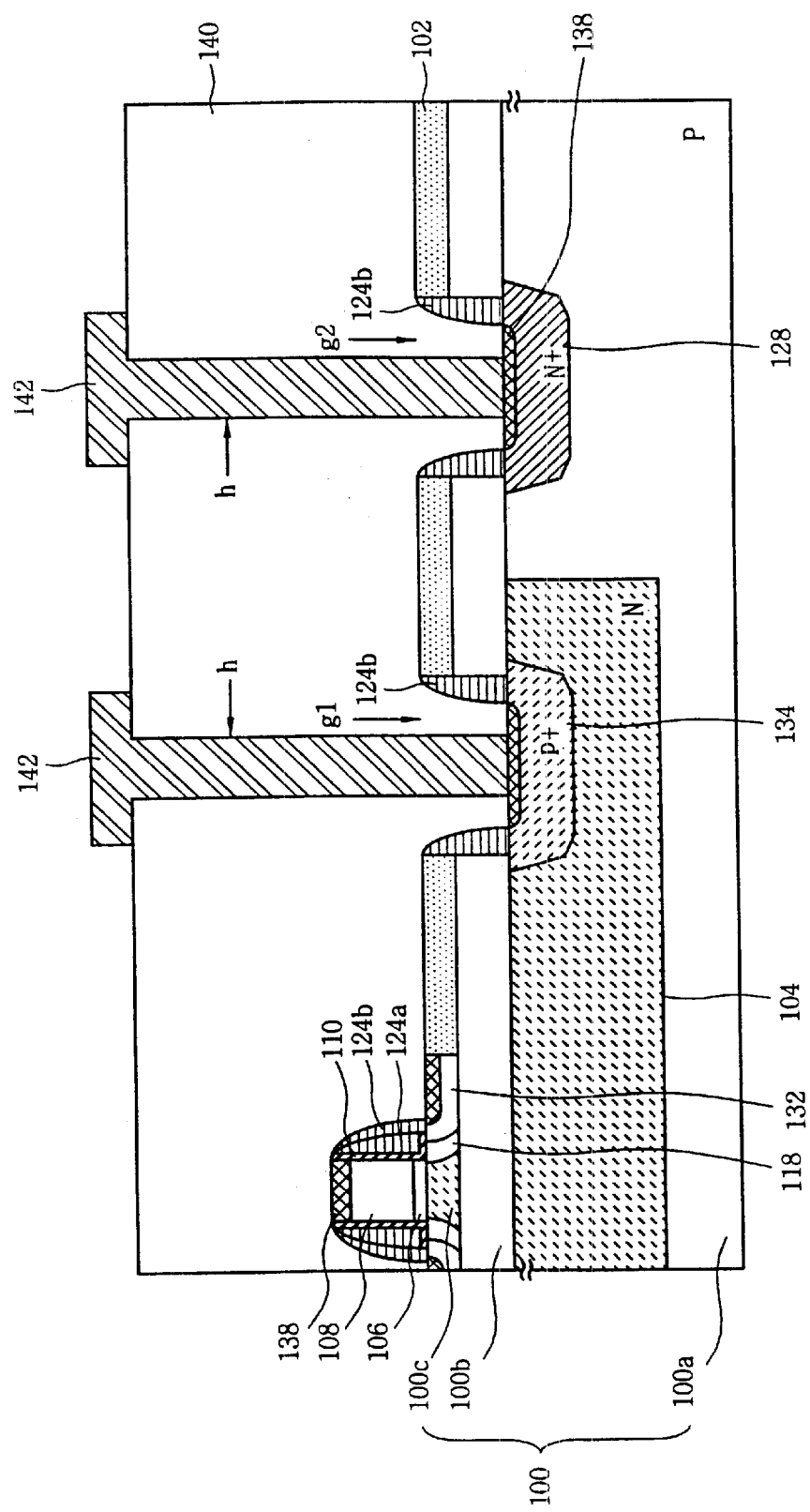

SEMICONDUCTOR DEVICE HAVING SILICON ON INSULATOR AND FABRICATING METHOD THEREFOR

RELATED APPLICATIONS

This application is a divisional of U.S. application Ser. No. 09/658,099 filed on Sep. 8, 2000, now U.S. Pat. No. 6,407,429 the contents of which are incorporated herein in their entirety by reference.

BACKGROUND OF THE INVENTION

1. Field of the Invention

The present invention relates to a semiconductor device utilizing silicon on insulator technology (hereinafter referred to as SOI semiconductor device) and a fabricating method therefor, and more particularly to a SOI semiconductor device and a method for fabricating the SOI semiconductor device which minimizes current leakage at junctions occurring at the lateral sides of diffusion regions to be used for diodes or well resistors.

2. Description of the Prior Art

Recently, great attention has been drawn to the SOI technique, in which a single crystal silicon layer is formed on an insulating layer in order to more deeply integrate elements. When the aforementioned SOI technique is applied to fabricating a semiconductor device, it can reduce parastic capacitance in driving the device to thereby improve operational speed and reduce power consumption, as compared to a general bulk silicon device.

However, arising from the structural characteristics of the SOI semiconductor device, a silicon substrate and an element formed thereon are completely separated by an insulating layer (named a BOX (buried oxide) layer), thereby making it impossible to provide an element like a diode into a lateral device for integrating electronic circuits onto the SOI substrate. In addition, there is a limitation in use of a well-structured element as a resistor in the integrated circuits. Therefore, it becomes impossible to make the diode in the vertical NPN (or PNP) structure which, for example, has been commonly deployed in electro-static discharge (ESD) circuits, and the like.

There has been a great deal of difficulty in fabricating an integrated circuit having a limitation in area to be formed as a lateral-type device. If a vertical NPN (or PNP) diode is replaced with a lateral NPN (or PNP) diode, its actuated driving capacity is known to drop to approximately half. Therefore, it is necessary to fabricate the element (diode) of the lateral NPN structure twice as large as that of the vertical NPN structure, in order to compensate for this limitation. Accordingly, a larger circuit area is also proportionally required for fabricating a larger element, resulting in a negative effect on the integration level of the highly integrated circuit.

Therefore, in order to fabricate an element in the same structure within the same area as used for the conventional semiconductor device, the SOI semiconductor device is fabricated, rather than as a lateral structure of the NPN (or PNP) diode or a well-structured resistor of the ESD circuit, by selectively etching a predetermined portion of the upper silicon layer and the BOX layer, and by forming the element in a lower silicon layer.

FIG. 1 is a cross-sectional view for illustrating a conventional structure of a SOI semiconductor device fabricated in the prior art. A semiconductor device having a diode will be described as an embodiment of the prior art.

According to FIG. 1, the conventional SOI device comprises: a SOI substrate 10 having a surface silicon layer 10c formed by inserting an insulating layer 10b onto a P-type semiconductor substrate 10a; an element isolating layer 12 formed at a predetermined portion (an element-separating region) of the surface silicon layer 10c with its bottom surface contacting the insulating layer 10b; a gate electrode 16 formed by inserting a gate insulating layer 14 at a predetermined portion of the surface silicon layer 10c; insulating spacers 20 formed at both lateral walls of the gate electrode; source/drain regions 22 formed in the surface silicon layer 10c at both edges of the gate electrode 16 with their lower portiond contacting the insulating layer 10b; a first groove (g1) formed at one side of the gate electrode 16 by etching the surface silicon layer 10c and the insulating layer 10b to expose a predetermined portion of an active region of an N well 24 formed inside the semiconductor substrate 10a; a P type of a first diffusion region 26 formed in the N well 24 under the first groove (g1); a second groove (g2) formed at one side of the first diffusion region 26 by etching the surface silicon layer 10c and the insulating layer 10b to expose a predetermined portion of the active region of the silicon substrate 10; an N+ type of a second diffusion region 28 formed in the silicon substrate 10a under the second groove (g2); an interlevel insulating layer 30 with a plurality of contact holes (h) formed on the resultant structure to expose predetermined portions of the first and second diffusion regions 26, 28; and metal wires 32 formed for separately connecting the first and second diffusion regions 26, 28. Reference numeral 18 represents a silicide layer formed to reduce voltage levels of gate electrodes and contact wires, as is known in the art.

Accordingly, in the case of an SOI device thus constructed, the surface silicon layer 10c surrounded by the insulating layer 10b and the element isolating layer 12 is used as a transistor channel region, the first diffusion region 26 and the N well 24 for a P+/N diode, and the second diffusion region 28 and the P type silicon substrate 10a for a N+/P diode.

Design and manufacture of the aforementioned SOI device carries with it a number of difficulties and limitations. Since the silicide layer 18 is generally fabricated with a rough bordering surface, it is very likely that the length l1 (designated by reference symbol I in FIG. 1) between the silicide layer 18 and the diffusion regions 26, 28 at the both edges of the diffusion regions 26, 28 becomes partially smaller. Therefore, there is a problem in the aforementioned structure of the SOI semiconductor device in that the relatively short length between the silicide layer 18 and the diffusion regions 26, 28 results in an increase of current leakage at junctions flowing toward the P type semiconductor substrate 10a for the backward-oriented diodes, and not in the forward diodes.

Therefore, the reduction in characteristics of the backward diode also leads to reduction in functional characteristics of the driving semiconductor device. Even worse, if the diffusion regions 26, 28 and the silicide layer 18 become too close, or contact each other, in the region designated by reference symbol I, there may be an electric short between the first diffusion region 26 and the N well 24, or between the second diffusion region 28 and the semiconductor substrate 10a. As a consequence, the first and second diffusion regions 26, 28 will not properly operate as diodes, leading to device malfunction.

SUMMARY OF THE INVENTION

Therefore, it is an object of the present invention to address the aforementioned limitations by providing an SOI semiconductor device designed in a double-junction structure (for instance, a P− or N− layer surrounding a P+ or N+ layer) of different density of diffusion regions with spacers to be used for diodes (or well resistors) and a method for fabricating the SOI semiconductor device, in which silicide layers are formed only on the high density impurity layers, that is, on the surface of P+ and/or N+ layers, to secure a sufficient length between the silicide layers and the diffusion regions. This configuration prevents deterioration of the functional characteristics of the semiconductor device due to current leakage at the junctions.

It is another object of the present invention to provide an SOI semiconductor device designed in a single junction structure of diffusion regions to be used for diodes (or well resistors) and a method for fabricating the SOI semiconductor device, in which parts to form silicide layers are restricted on the diffusion regions with spacers to establish and secure a sufficient length between the silicide layers and the diffusion regions, thereby preventing the semiconductor device from reducing in its operational characteristics due to current leakage at junctions.

In order to accomplish the aforementioned objects of the present invention, there is provided a SOI semiconductor device comprising: a first conductivity type semiconductor substrate; a surface silicon layer formed on an insulating layer applied to the semiconductor substrate; an element isolating layer formed at predetermined portions of the surface silicon layer; a transistor formed on the surface silicon layer with a central gate electrode, gate spacers at both lateral walls and a source/drain region in the surface silicon layer at both edges of the spacers; a groove formed at one side of the transistor by sequentially etching the element isolating layer and the insulating layer in the surface silicon layer to expose a predetermined portion of a second conductivity type well formed in the semiconductor substrate; groove spacers formed at both lateral walls of the groove; a first conductivity type of a diode diffusion region formed in the second conductivity type well under the groove; and a silicide layer respectively formed on the gate electrode, the surface exposing parts of the source/drain region and the diode diffusion regions between spacers.

At this time, the diode diffusion regions are preferably constructed in a single junction structure of a high density of impurity or in a double junction structure where a low density of an impurity layer surrounds a high density of an impurity layer. If the diode diffusion regions are constructed in a single junction structure, the spacers to be formed in the transistor should be designed in a double structure.

In order to accomplish the first object of the present invention, there is provided a method for fabricating a first embodiment of a SOI semiconductor device comprising the steps of: forming a surface silicon layer in an insulating layer on a first conductivity type of a semiconductor substrate; forming an element isolating layer at predetermined portions of the surface silicon layer; selectively ion-implanting a second conductivity type of impurity at a transistor forming portion to dope a predetermined portion of the surface silicon layer and to form a second conductivity type of a well in the semiconductor substrate at the same time; forming a gate electrode by inserting a gate insulating layer onto the surface silicon layer doped with impurity; forming a groove by sequentially etching the element isolating layer and the insulating layer of the surface silicon layer with a mask pattern that restricts a diode forming part, to expose a predetermined surface portion of the second conductivity type well at one side of the gate electrode; forming an LLD region in the surface silicon layer at both edges of the gate electrode by selectively ion-implanting the first conductivity type of a low density of impurity to a transistor forming part and, then, forming a low density impurity layer in the second conductivity type well under the groove; forming gate spacers at both lateral walls of the gate electrode and forming groove spacers at the lateral walls of the groove; forming a source/drain region in the surface silicon layer at both edges of the gate electrode by selectively ion-implanting the high density of the first conductivity type of impurity only to the transistor forming part and, then, forming in the second conductivity type of a well under the groove a double junction structure of the diode diffusion region where the first conductivity type of a low density of an impurity layer surrounds the same type of a high density of an impurity layer; and forming a self-aligned silicide layer on the diode diffusion regions between the surface exposing parts of the source/drain region having the gate electrode and the spacers.

In order to accomplish the second object of the present invention, there is provided a method for fabricating the second embodiment of a SOI semiconductor device comprising the steps of: forming a surface silicon layer on an insulating layer applied to a first conductivity type semiconductor substrate; forming an element isolating layer at a predetermined portion of the surface silicon layer; selectively ion-implanting a second conductivity type of impurity only to a transistor forming part to dope a predetermined portion of the surface silicon layer and, at the same time, forming a second conductivity type of a well in the semiconductor substrate; forming a gate electrode by inserting a gate insulating layer to the surface silicon layer doped with impurity; forming an LLD region in the surface silicon layer at both edges of the gate electrode by selectively ion-implanting the first conductivity type of a low density of impurity to the transistor forming part; forming first spacers at both lateral walls of the gate electrode and at those of the groove; forming a groove by sequentially etching the element isolating layer and insulating layer of the surface silicon layer with a mask pattern that restricts a diode forming part, to expose a predetermined surface portion of the second conductivity type of a well at one side of the gate electrode; forming a source/drain region in the surface silicon layer at both edges of the gate electrode by selectively ion-implanting the first conductivity type of a high density of impurity only to the transistor forming part and, then, forming a single junction structure of the diode diffusion region in the second conductivity type well under the groove; forming second spacers at external sides of the first spacers and at both lateral walls of the groove; and forming a self-aligned silicide layer on the diode diffusion region between the surface exposing part of the source/drain region having the gate electrode and the second spacers.

With the SOI semiconductor device thus constructed, the extent of the silicide layer portion is restricted to a range of space defined between spacers. As a result, it is possible to ensure that the resulting minimum length between the silicide layer and the diode diffusion region is much greater in the present invention than in the prior art. This serves to minimize current leakage at both lateral sides of the diode diffusion region, so as to prevent deterioration of the backward diode characteristics in driving the device.

BRIEF DESCRIPTION OF THE DRAWINGS

Objects and aspects of the invention will become apparent from the following description of embodiments with reference to the accompanying drawings in which:

FIGS. 3a through 3m are sequential operational views for illustrating a method for fabricating the SOI semiconductor device shown in FIG. 2;

FIG. 4 is a cross-sectional view for illustrating a SOI semiconductor device in accordance with a second embodiment of the present invention; and FIGS. 5a through 5k are sequential operational views for illustrating a method for fabricating the SOI semiconductor device shown in FIG. 4.

DETAILED DESCRIPTION OF PREFERRED EMBODIMENTS

Figure 1:
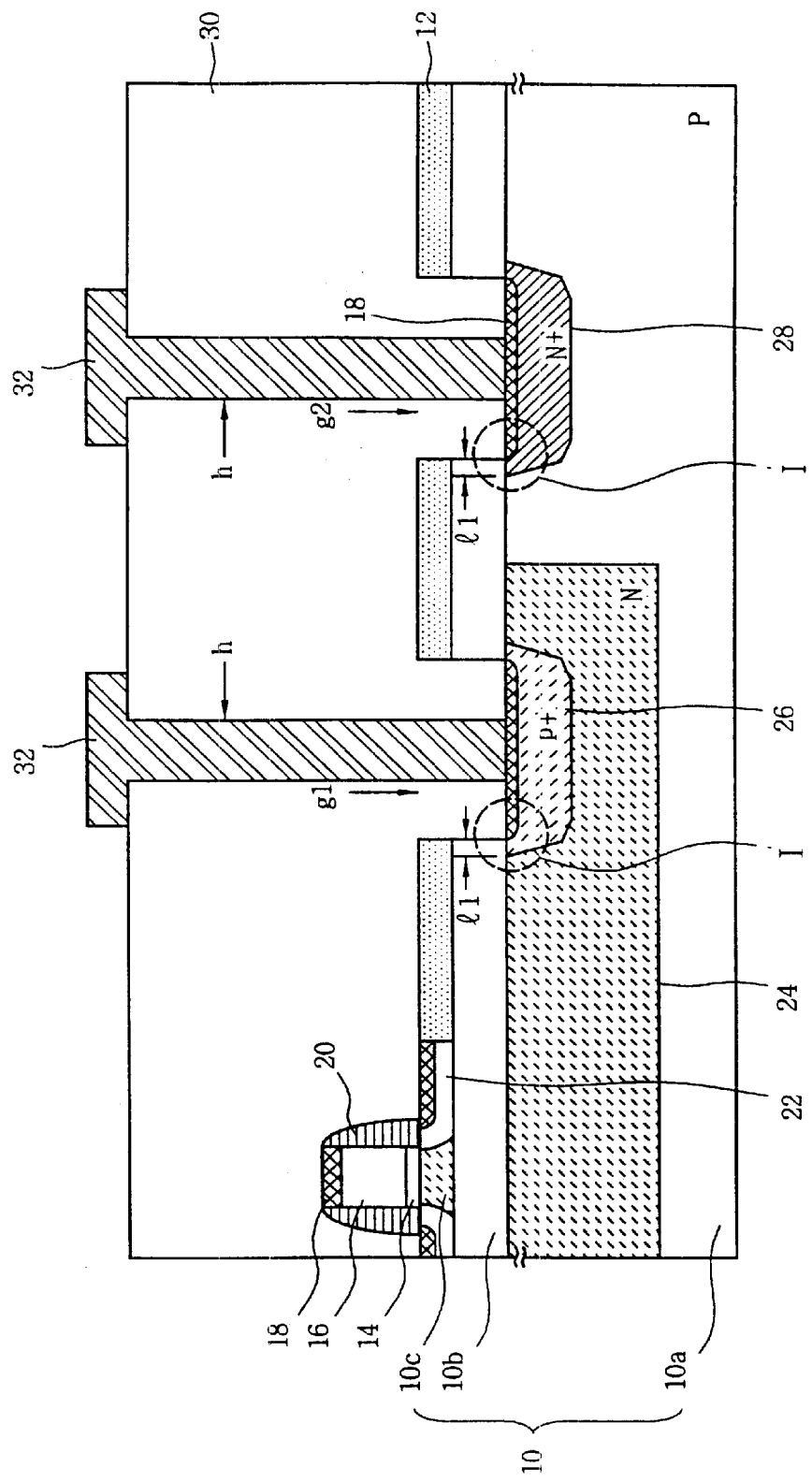
FIG. 1 is a cross-sectional view for illustrating a conventional SOI semiconductor device.

Hereinafter, preferred embodiments of the present invention will be described in detail with reference to accompanying drawings, in which like reference numerals represent similar components throughout the various views.

Figure 2:
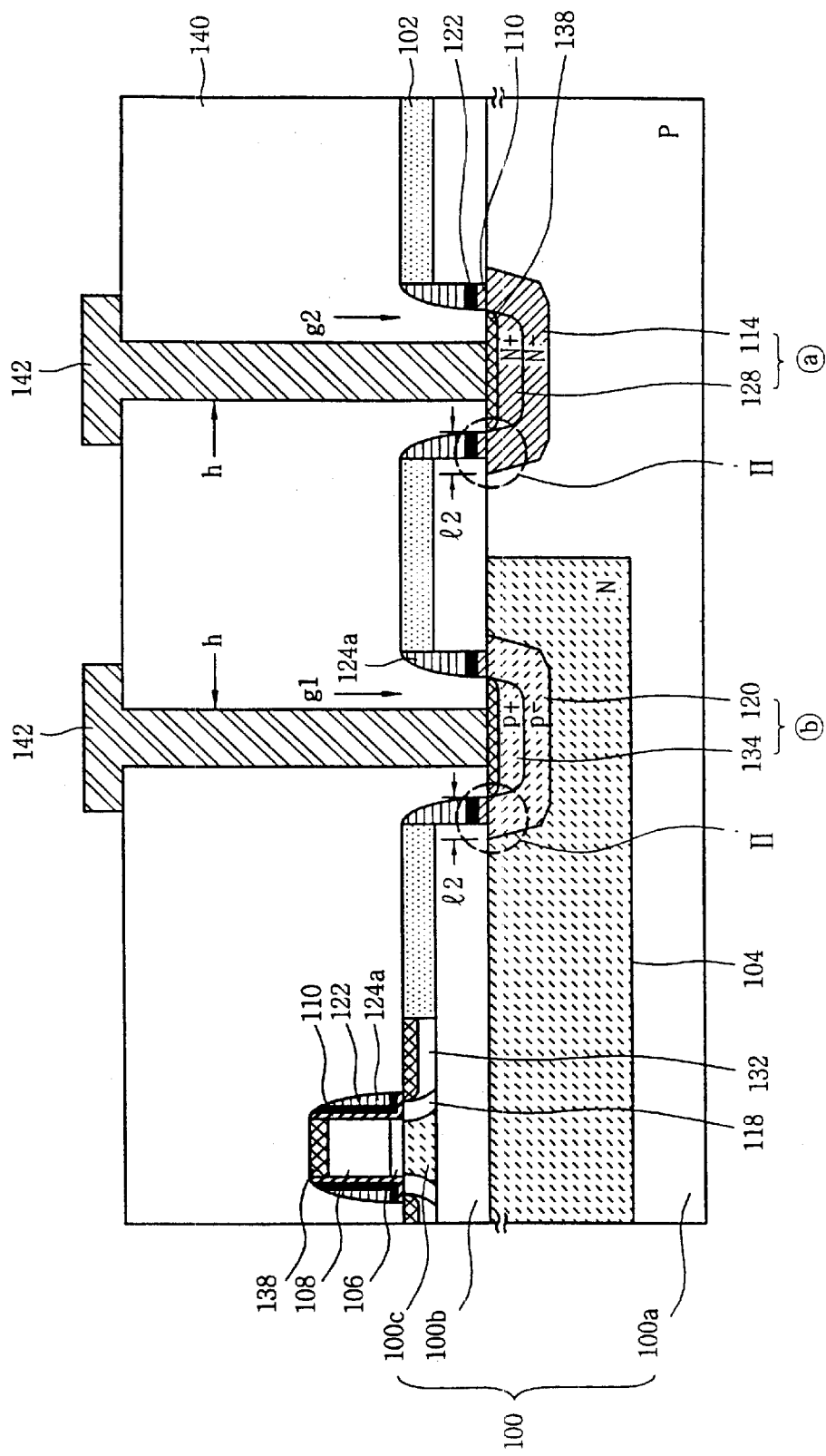
FIG. 2 is a cross-sectional view for illustrating a SOI semiconductor device in accordance with a first embodiment of the present invention.

FIG. 2 is a cross-sectional view for illustrating a SOI semiconductor device in accordance with a first embodiment of the present invention. With reference to the cross-sectional view of the SOI device shown in FIG. 2, the structure of the SOI device will be described in detail below. As an example, the SOI semiconductor device having diodes will be described as the first embodiment of the present invention.

As shown in FIG. 2, the SOI device of the present invention comprises: an SOI substrate 100 in which a surface silicon layer 100c is formed by inserting an insulating layer 100b over a P type semiconductor substrate 100a; an element isolating layer 102 formed at a predetermined portion of the surface silicon layer 100c (an element isolating part) with its bottom part being placed on the insulating layer 100b; a polysilicon gate electrode 108 formed at a predetermined portion of the surface silicon layer 100c by inserting a gate insulating layer 106; insulating spacers 124a formed at both lateral walls of the gate electrode 108 by inserting the first and second oxide layers 110, 122; an LDD structure of a source/drain region 132 formed at internal sides of the surface silicon layer 100c at both edges of the gate electrode 108 with its bottom part being placed on the insulating layer 100b; a first groove (g1) formed at one side of the gate electrode 108 by etching the element isolating layer 102 and insulating layer 100b to expose a predetermined portion of N well 104 formed in the semiconductor substrate 100a; a second groove (g2) formed at one side of the first groove (g1) by etching the element isolating layer 102 and insulating layer 100b to expose a predetermined portion of the semiconductor substrate 100a; insulating spacers 124a formed at both lateral walls of the grooves; a first diffusion region (b) formed in the N well 104 under the first groove (g1) in the double junction structure where a P– layer (a low density of a P type impurity layer) 120 surrounds a P+ layer (a high density of a P type impurity layer) 134; a second diffusion region (a) formed in the semiconductor substrate 100a under the second groove (g2) in the double junction structure where an N– layer (a low density of an N type impurity layer) 114 surrounds an N+ layer (a high density of an N type impurity layer) 128; silicide layers respectively formed on the first and second diffusion regions (b), (a) between the surface exposing part of the source/drain region 132 having the gate electrode 108 and the spacers 124a; an interlevel insulating layer 140 formed with a plurality of contact holes (h) to expose predetermined portions of the silicide layer 138 on the first and second diffusion regions (b), (a) over the resultant structure thus constructed; and a plurality of metal wires 142 placed on the insulating layer 140.

Therefore, in the SOI semiconductor device thus constructed, the surface silicon layer 100c surrounded by the insulating layer 100b and the element isolating layer 102 is used as a PMOS transistor channel region. The double junction structure of the first diffusion region (b) and N well 104 is made into a P/N diode, and the double junction structure of the second diffusion region (a) and P type semiconductor substrate 100a is made into an N/P diode.

While FIG. 2 illustrates the SOI semiconductor device having only the N well 104 formed in the semiconductor substrate 100a as a preferred embodiment of the present invention, the aforementioned structure of the device can also be constructed with addition of a P well in the semiconductor substrate 100a under the second groove (g2) so that the second diffusion region (a) can be formed in the P well, not on the semiconductor substrate 100a, or with addition of a P type impurity doping region to contact the N well 104 in the semiconductor substrate 100a between the N well 104 and the second diffusion region (a) without formation of a P well. If necessary, the SOI semiconductor device can be constructed with both of those elements (P well and P type impurity doping region) in order to enhance the insulating characteristic of the first and second diffusion regions (b), (a).

FIGS. 3a through 3m are sequential operational views for illustrating a method for fabricating the SOI semiconductor device thus constructed. With reference to the accompanying drawings, the method for fabricating the SOI semiconductor device will be described in detail.

Figure 3A:
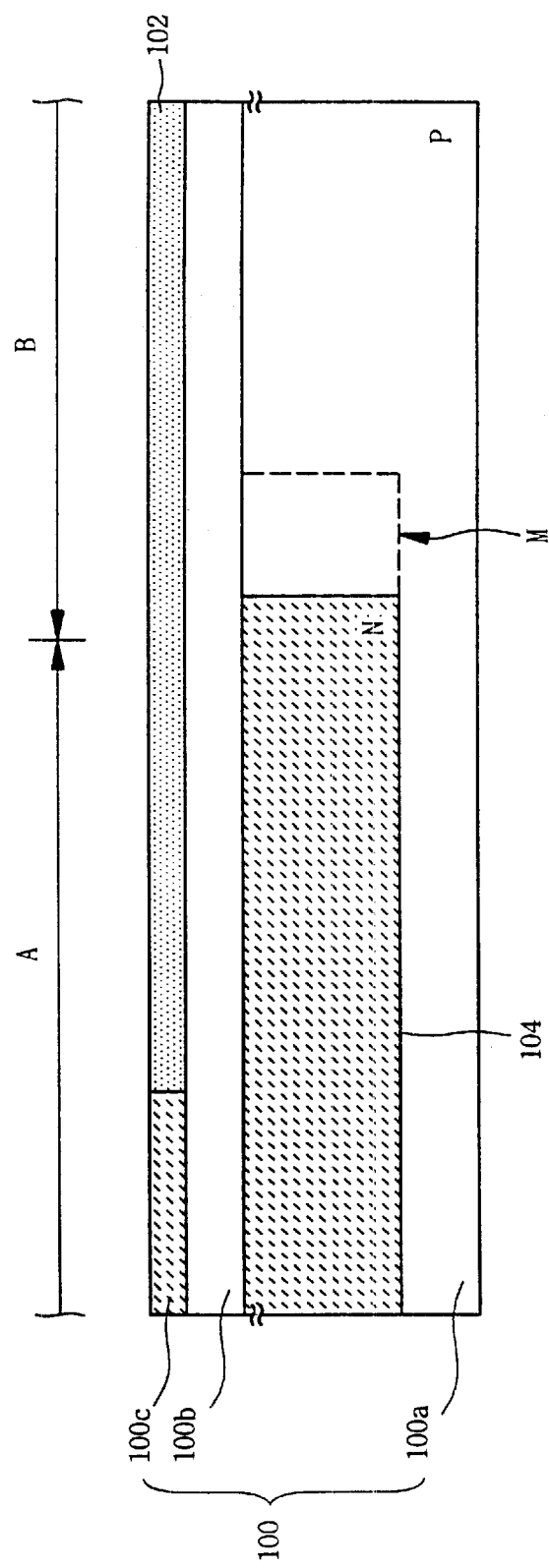

As shown in FIG. 3a, a SOI substrate 100 is sequentially formed with an oxide insulating layer 100b on a P type semiconductor substrate 100a and then a P type surface silicon layer 100c on the insulating layer 100b. Then, the surface silicon layer 100c to be used as an element isolating region is etched out, and a predetermined thickness of an oxide layer is formed over the resultant structure. A CMP process is performed to flatten and expose the surface of the surface silicon layer 100c to thereby form the element isolating layer 102. At this time, the element isolating layer 102 can also be formed through a LOCOS process, rather than a trench isolation process. Then, the NMOS transistor forming part (B) is masked to ion-implant an N type of impurity over the resultant structure, so as to dope with N type impurity the internal part of the surface silicon layer 100c located at a PMOS transistor forming part (A) and, at the same time, form an N well 104 in the semiconductor substrate 100a under the surface silicon layer 100c. At this time, the ion-implantation process of the N type impurity is repeated two or three times (surface ion-implantation, dip ion-implantation) to evenly dope impurity to the internal part of the surface silicon layer 100c and the semiconductor substrate 100a.

Even if only N well 104 has been formed in the semiconductor substrate 100a in the aforementioned embodiment of the present invention, an additional P well can also be formed in the semiconductor substrate 100a of the NMOS transistor forming part (B). Also, in order to enhance insulating characteristic, a field ion-implantation process is performed to the P well to additionally form a P type impurity doping region in the part designated by reference symbol M to be in contact with the N well 104. At this time, the process for forming a P well are performed in the following sequence. In other words, after formation of the N well 104, the P type impurity is ion-implanted to the resultant structure to dope the internal part of the surface silicon layer 100c positioned at the NMOS transistor forming part (B), with the PMOS transistor forming part (A) being masked, so that the P well (not shown) is simultaneously formed in the semiconductor substrate 100a under the NMOS transistor forming part (B).

If necessary, a field ion-implantation process is performed immediately after formation of the N well 104. As a result, the P type impurity doping region (not shown) can be formed instead of the P well.

Figure 3B:
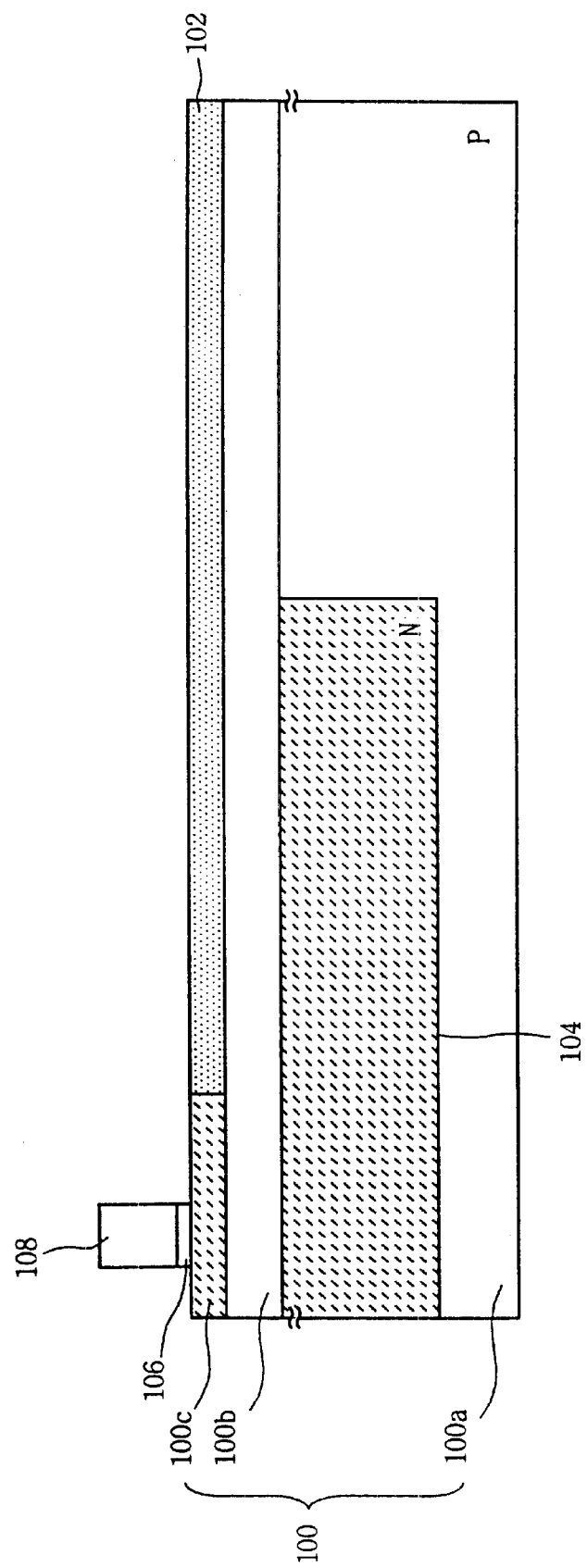

As shown in FIG. 3b, a gate insulating layer 106 is inserted on the surface silicon layer 100c surrounded by the element isolating layer 102 and the insulating layer 100b to form a polysilicon gate electrode 108.

Figure 3C:
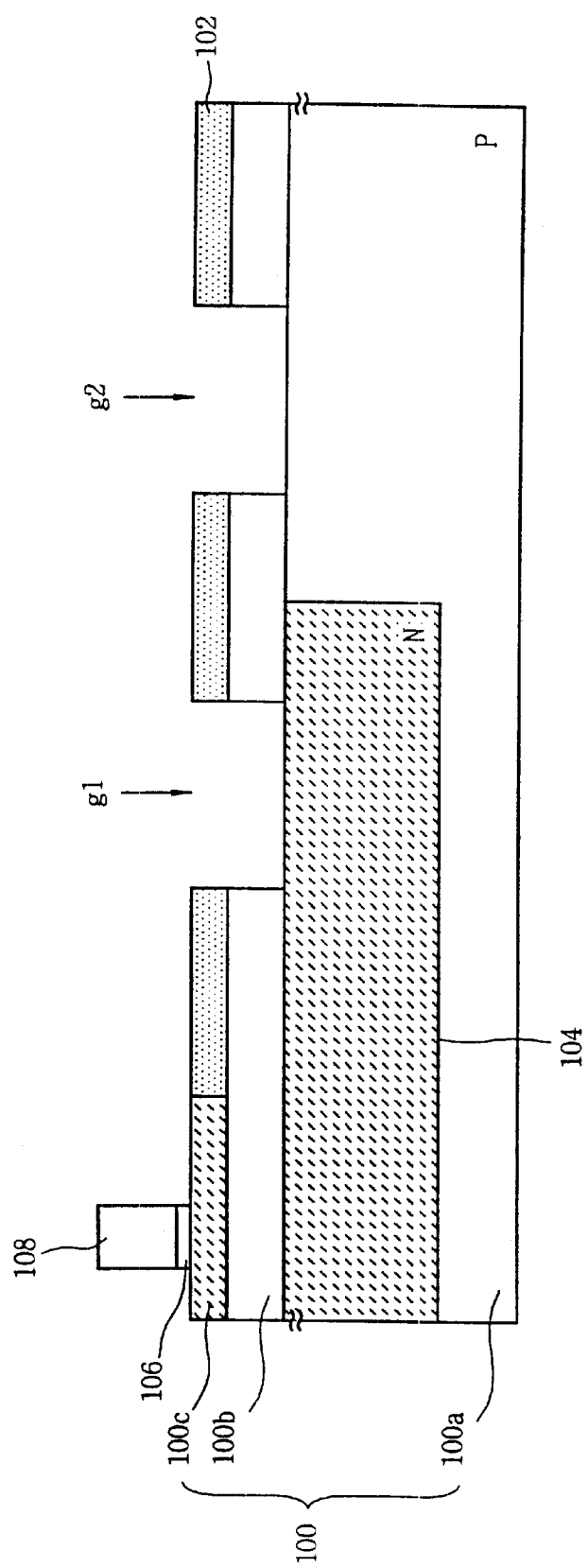

As shown in FIG. 3c, a mask pattern restricting a diode forming part is used for selectively etching the surface silicon layer 100c and the insulating layer 100b to respectively expose predetermined portions of the surfaces of N well 104 and semiconductor substrate 100a. As a result, a first groove (g1) is formed at one side of the gate electrode 108 with the element isolating layer 102 being positioned therebetween to expose a predetermined portion of the N well, and a second groove (g2) at the one side of the first groove (g1) with the element isolcating layer 102 being positioned therebetween to expose a predetermined portion of the semiconductor substrate 100a.

Figure 3D:
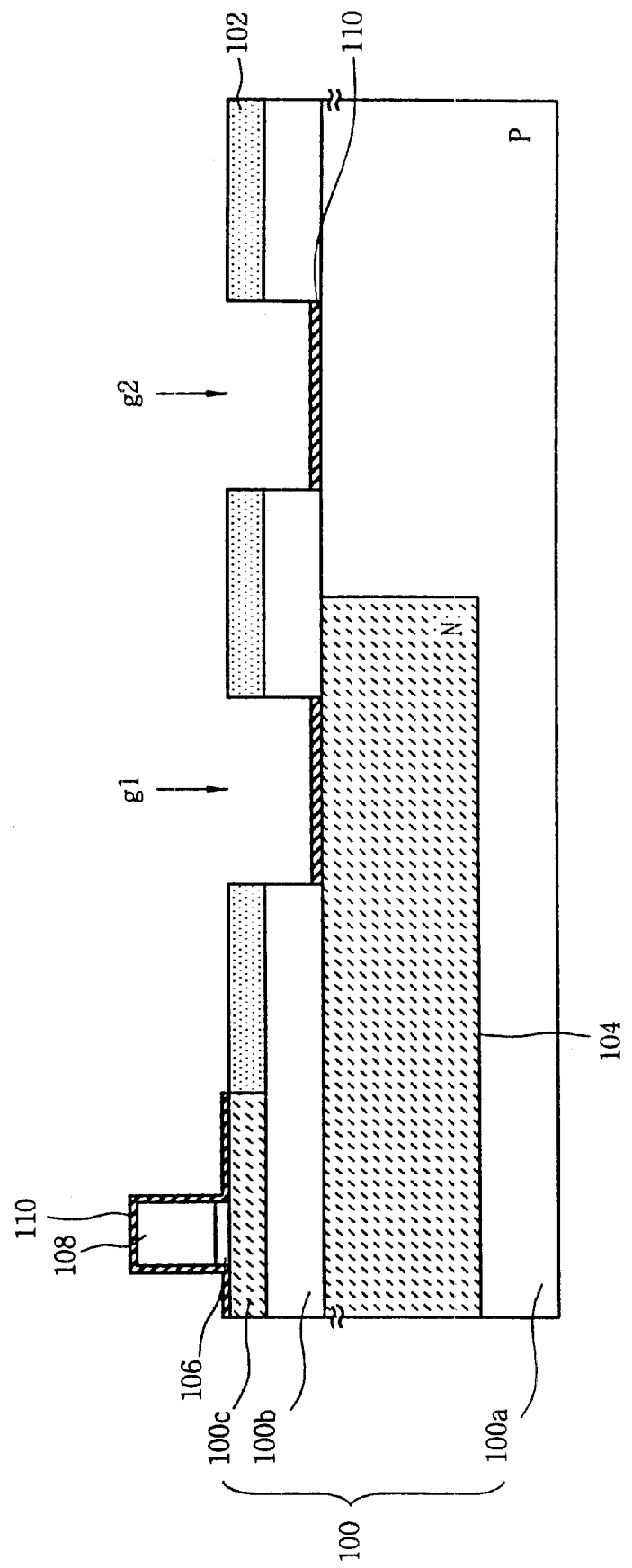

As shown in FIG. 3d, a thermal oxidation process is performed to form a thin first oxide layer 110 over the gate electrode 108, the surface silicon layer 100c, the N well 104 under the first groove (g1) and the semiconductor substrate under the second groove (g2).

Figure 3E:
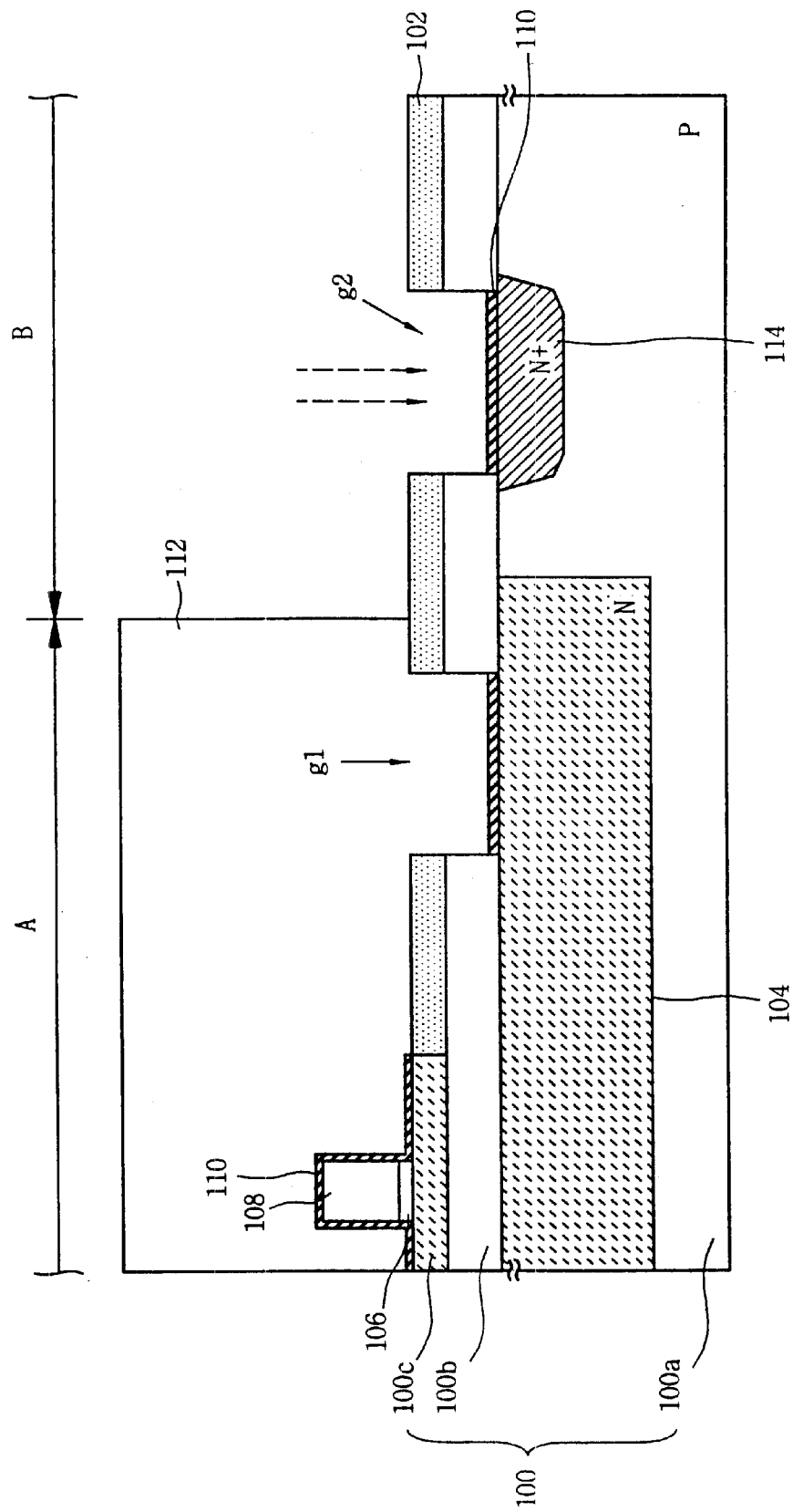

As shown in FIG. 3e, a first photo resist layer pattern 112 is formed on the PMOS transistor forming part (A) of the resultant structure, and then used as a mask to ion-implant a low density of N type impurity to the substrate. As a result, in both edges of the surface silicon layer of the gate electrode (not shown) positioned at the NMOS transistor forming part (B) a LDD region (not shown) is formed with its bottom part contacting the insulating layer 100b, and an N-layer 114, a low density of an N type impurity layer, is formed in the semiconductor substrate 100a under the second groove part (g2).

Figure 3F:
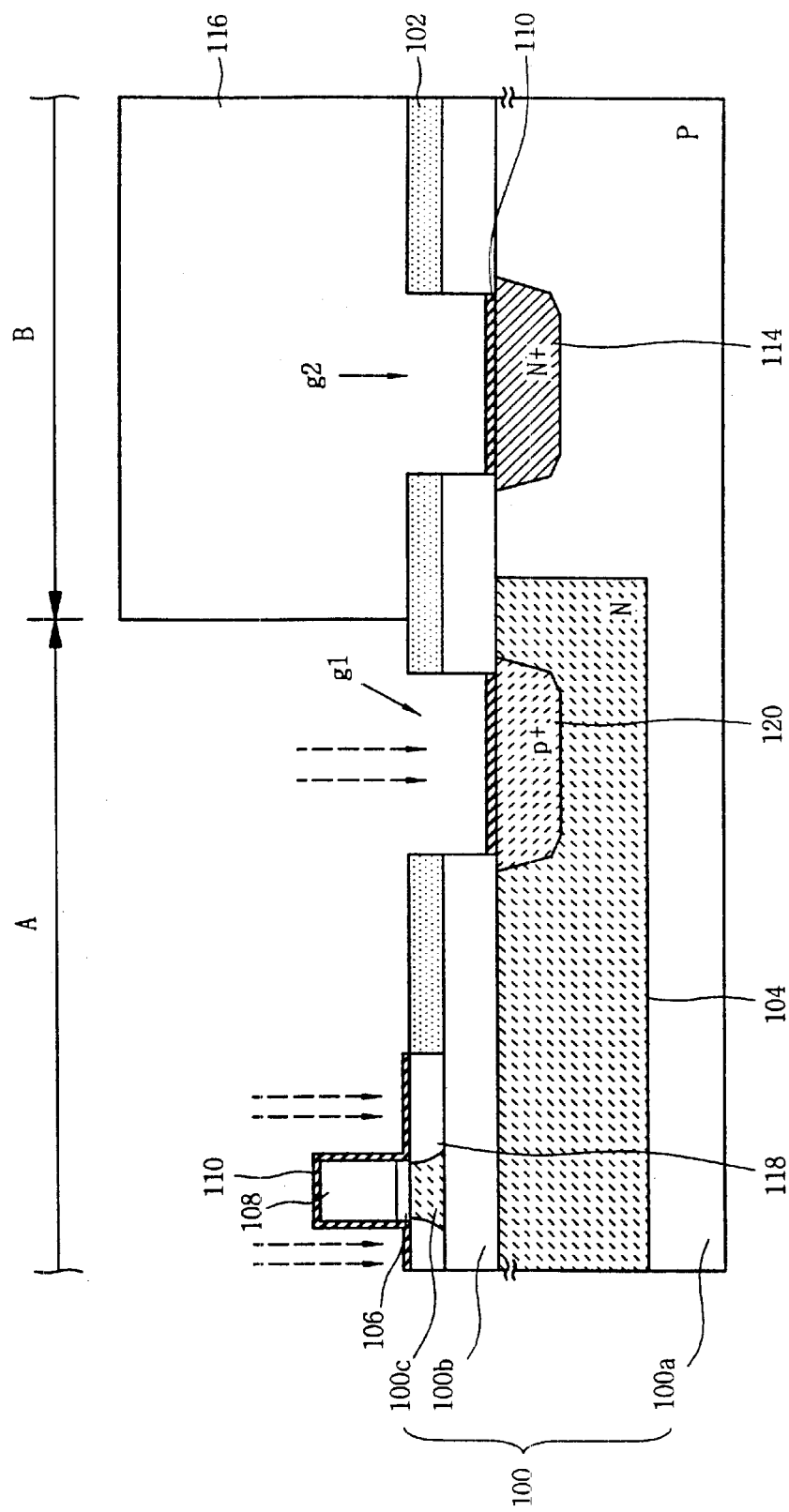

As shown in FIG. 3f, after removal of the first photo resist layer patter 112, a second photo resist layer pattern 116 is formed at the NMOS transistor forming part (B) of the resultant structure, and then used as a mask to ion-implant a low density of P type impurity to the substrate. As a result, in both edges of the surface silicon layer of the gate electrode 108 positioned at the PMOS transistor forming part (A) an LDD region 118 is formed with its bottom part contacting the insulating layer 100b, and a P- layer 114, a low density of a P type impurity layer, is formed in the N well 104 under the first groove (g1).

Figure 3G:
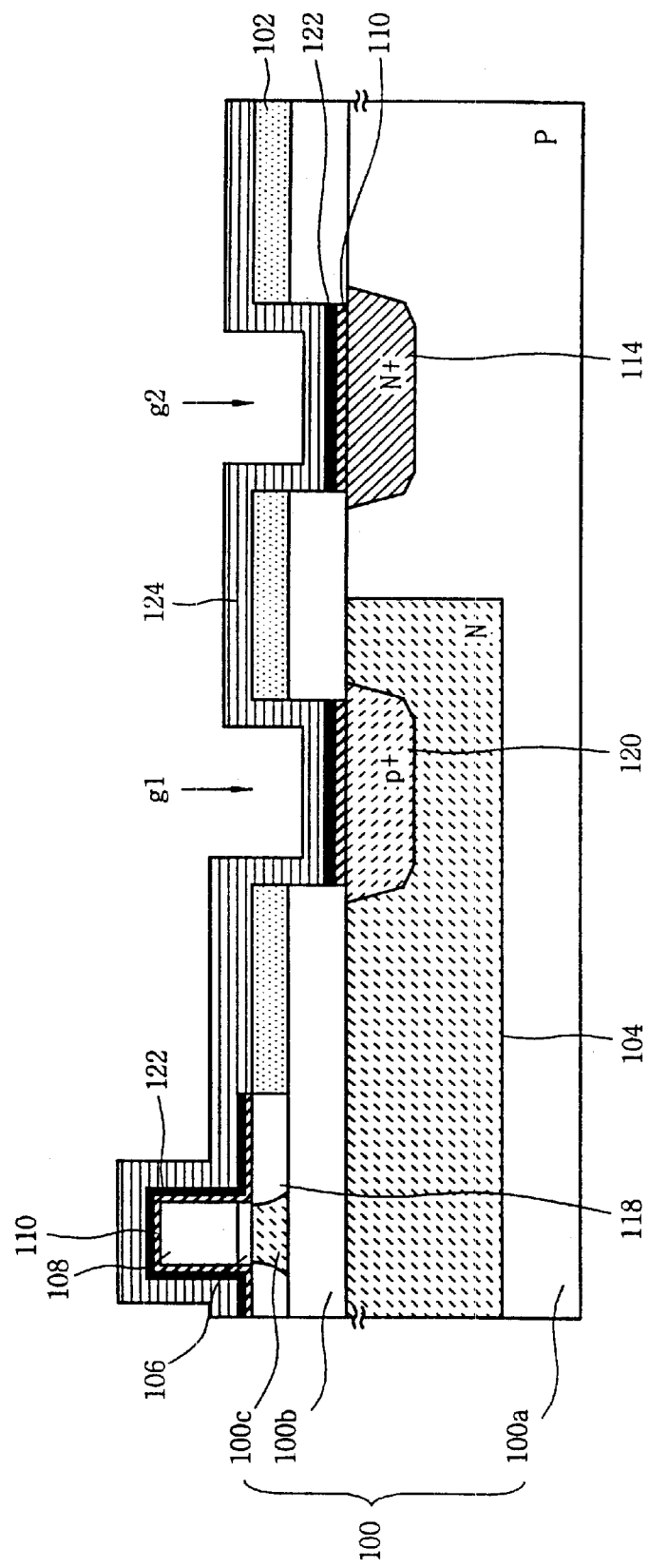

As shown in FIG. 3g, in order to compensate for the thickness of the gate insulating layer and prevent any damage of a dry etching process to the surface of the substrate, a thin second oxide layer 122 is added as a way to increase the thickness of the first oxide layer 110. Accordingly, a predetermined thickness of the insulating layer 124 is over the resultant structure. The insulating layer 124 is preferably constructed in an oxide or nitride layer or in a deposition structure of oxide and nitride layers.

Figure 3H:
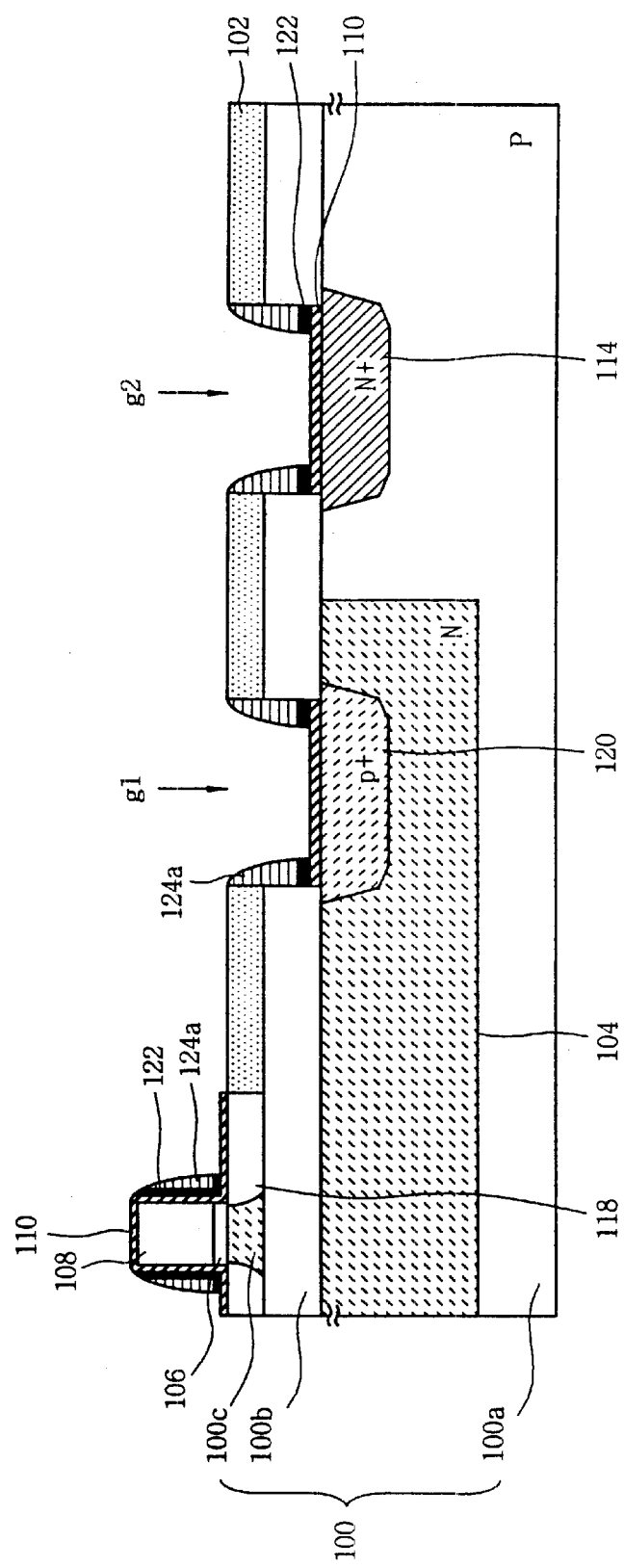

As shown in FIG. 3h, a bi-directional dry etching process is performed to the insulating layer 124 to expose the element isolating layer 102, so that insulating spacers 124a are formed at both lateral walls of the gate electrode 108 and the first and second grooves. In this process, a part of the second oxide layer 122 is also etched out, only a predetermined thickness of the first oxide layer 110 remains on the surface silicon layer 100b and the first and second grooves (g1), (g2) after completion of the dry etching process.

Figure 3I:
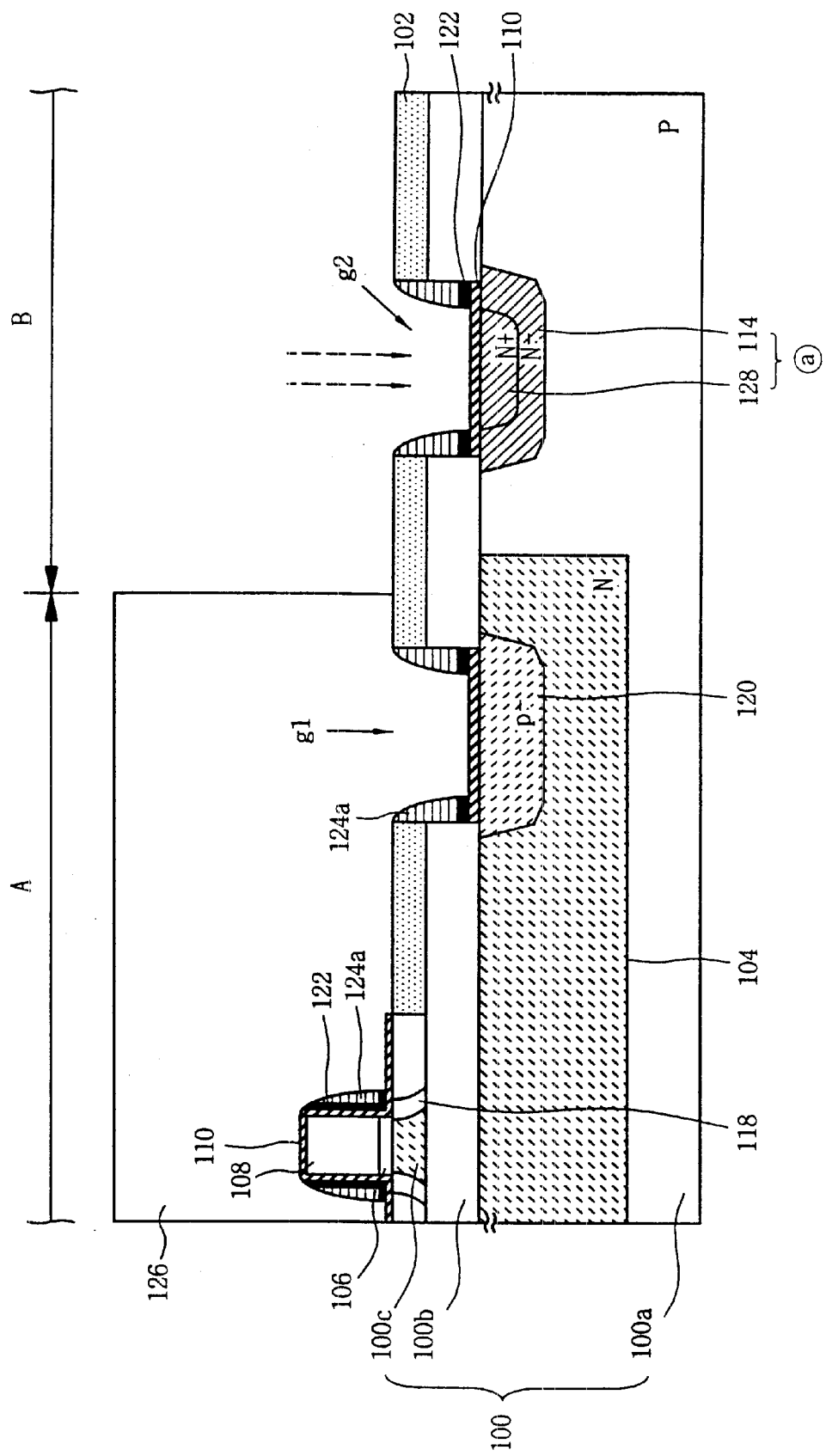

As shown in FIG. 3i, a third photo resist layer pattern 126 is formed on the PMOS transistor forming part (A) of the resultant structure and used as a mask for ion-implanting a high density of the N type impurity to the substrate. An LDD structure of source/drain region (not shown) is formed in the surface silicon layer at both edges of the gate electrode (not shown) placed at the NMOS transistor forming part (B), and a N+ layer 128, a high density of the N type impurity layer, is formed in the N- layer 114 under the second groove (g2). As a result, a second diffusion region (a) is constructed in a double junction structure in which the N- layer 114 surrounds the N+ layer 128 in the semiconductor substrate under the second groove (g2).

Figure 3J:
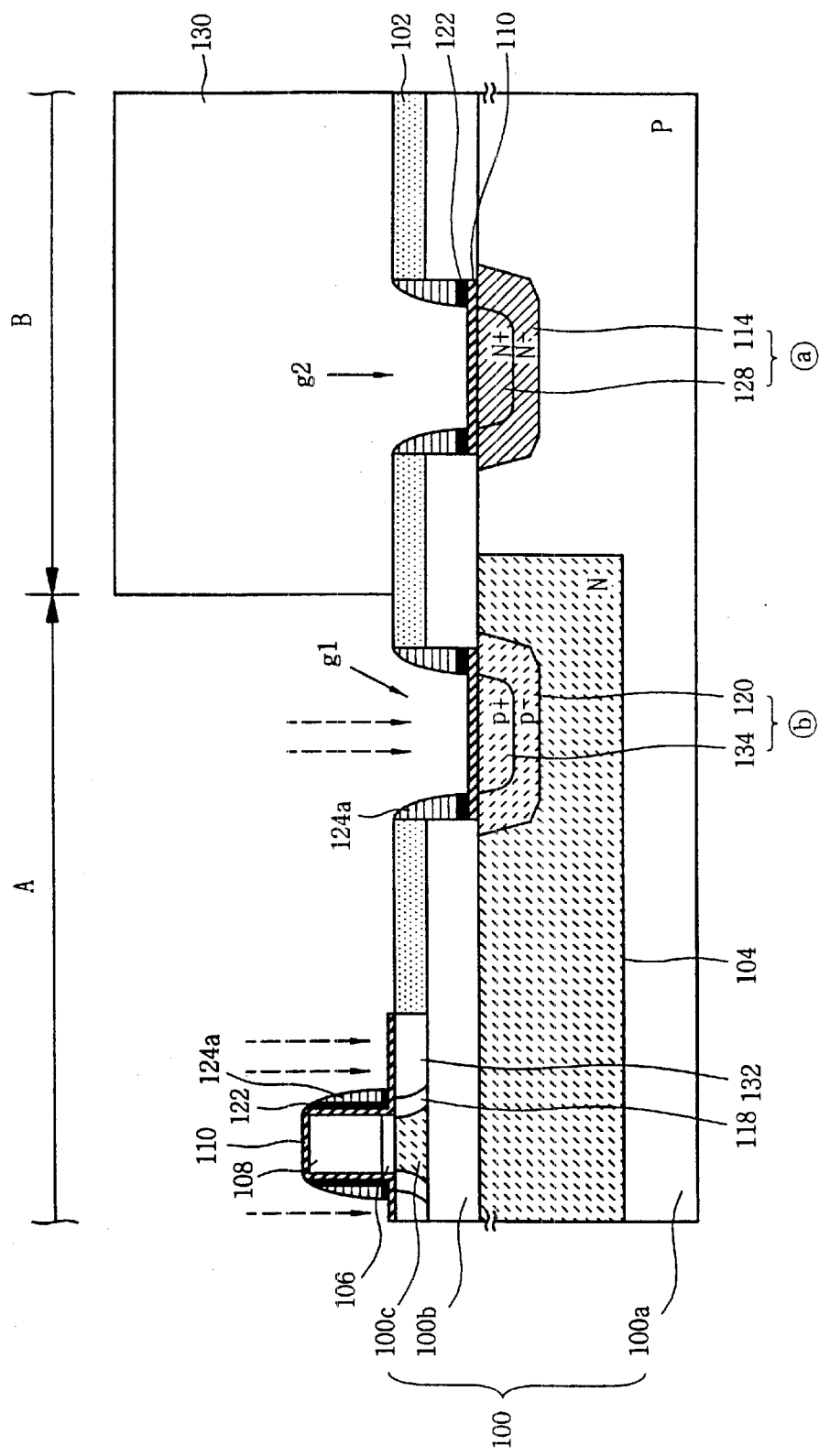

As shown in FIG. 3j, after removal of the third photo resist pattern 126, a fourth photo resist layer pattern 130 is formed on the NMOS transistor forming part (B) of the resultant structure and used as a mask for ion-implanting a high density of the P type impurity to the substrate. An LDD structure of source/drain region 132 is formed in the surface silicon layer 100c at both edges of the gate electrode 108 placed at the PMOS transistor forming part (A), and a P+ layer 134, a high density of a P type impurity layer, is formed in the P- layer 120 under the first groove (g1). As a result, a first diffusion region (b) is constructed in a double junction structure in which the P- layer 120 surrounds the P+ layer 134 in the N well 104 under the first groove (g1).

Figure 3K:
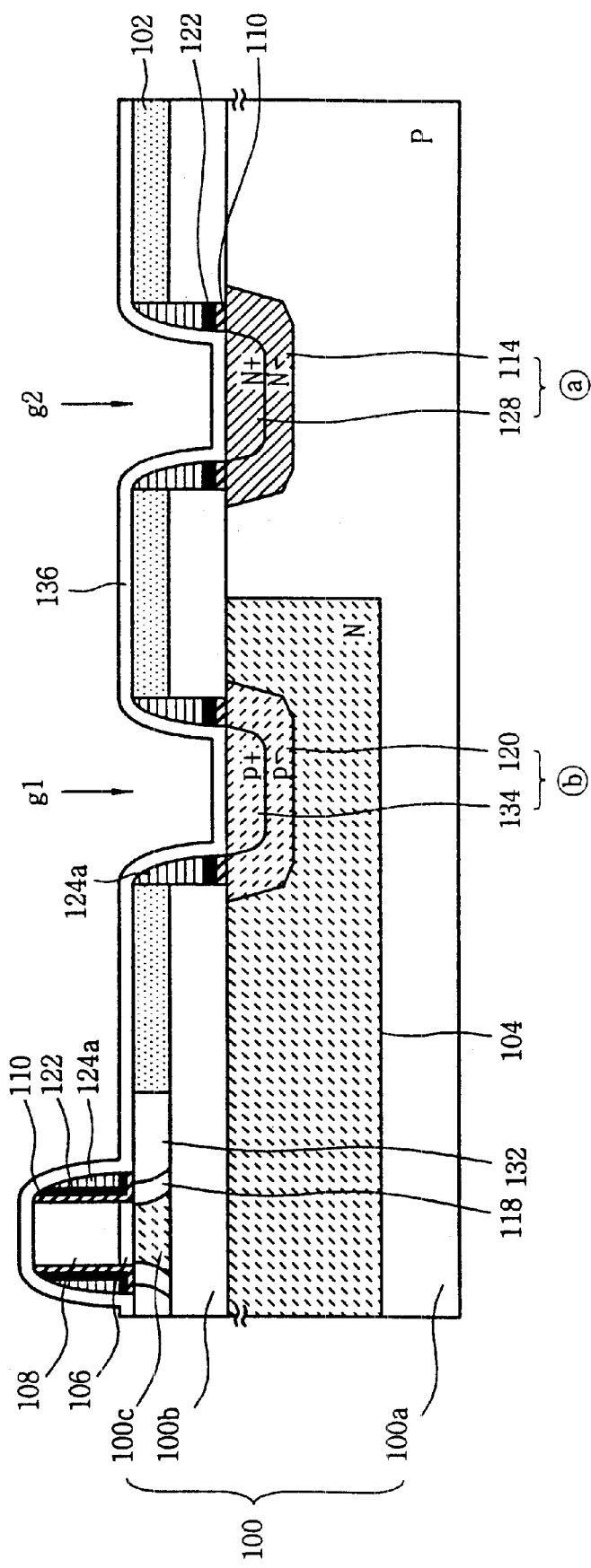
Figure 31:
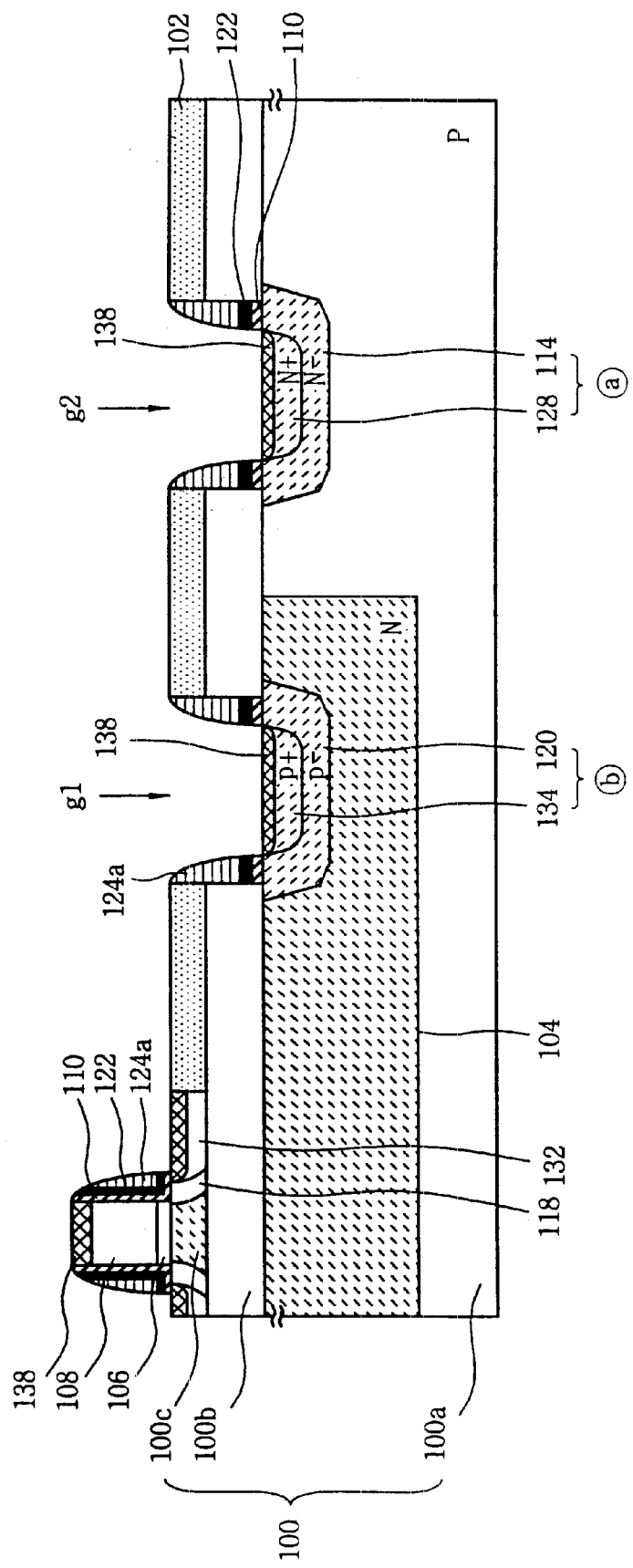

As shown in FIG. 3k, after removal of the fourth photo resist layer pattern 130, a surface exposing part of the first oxide layer 110 is etched out, a refractory such as Co, Ti or Ni refractory 136 is applied over the resultant structure.

As shown in FIG. 3l, the refractory 136 is thermally treated to form a self-aligned silicide layer 138 on the gate electrode 108, the source/drain region 132, the P+ layer 134 and N+ layer 128 under the first and second grooves (g1), (g2). Then, the refractory 136 remaining after reaction is removed. Likewise, the silicide layer 138 is selectively formed only on the gate electrode 108, the source/drain region 132, the P+ layer 134 and the N+ layer 128 because the element isolating layer 102 and the spacers 124a have formed in the remainder of the resultant structure, thereby preventing a direct reaction of silicon and refractory.

Figure 3M:
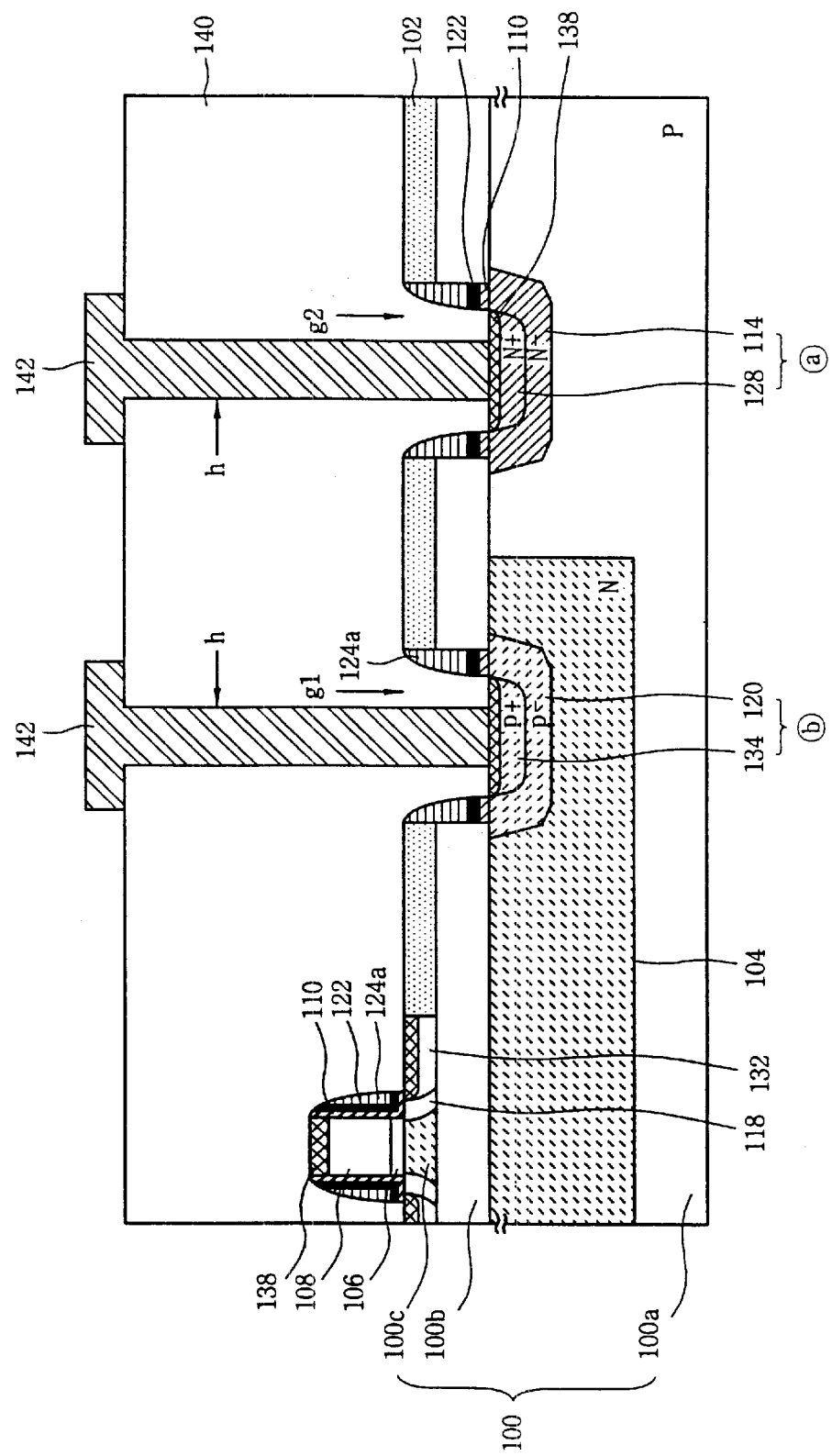

As shown in FIG. 3m, an insulating interlayer 140 is formed over the resultant structure and, then, selectively etched to expose the predetermined portions of the silicide layer 138 of the first and second diffusion regions (b, a) to form a plurality of contact holes (h). Then, a plurality of contact wires 142 are installed in the insulating layer 140 for separately connecting the first and second diffusion regions. The contact wires 142 may comprise, for example, Al or Cu alloy.

If the SOI device is fabricated in the structure shown in FIG. 2 according to the aforementioned operational processes, the SOI device is constructed in a double junction structure where the first and second diffusion regions (b, a) are formed with a low density impurity layer surrounding a high density impurity layer and with the spacers being formed at both lateral walls of the first and second grooves (g1, g2); and the parts to form the silicide layers 138 in the diffusion regions are restricted to the upper surfaces of the impurity layers, the P+ layer 134 and N+ layer 128, thereby making it possible to respectively secure a length (l1) between the silicide layer 138 and the diffusion region (b, a), greater than that in the prior art, at the both edges of the upper ends of the diffusion regions (b, a) (the parts designated by reference symbols II). As a result, in the SOI device thus constructed, there are advantages in minimizing power leakage at both lateral sides of the first and second diffusion regions (b, a) and in preventing reduction of backward diode characteristics of the device.

FIG. 4 is a cross-sectional view for illustrating the structure of the SOI device in accordance with a second embodiment of the present invention.

The SOI device shown in FIG. 4 is different from that shown above in FIG. 2 in that the first and second diffusion regions are constructed in a single junction structure of P+ and N+ layer 134, 128, and not in a double junction structure (for instance, the structure in which a P− or N− layer surrounds a P+ or N+ layer), and a double structure of spacers 124a, 124b are formed at both lateral walls of the gate electrode 108. Otherwise, the second embodiment of the present invention is constructed in the same basic structure as the first embodiment of the present invention. Therefore, it is not necessary to describe the identical basic structure of the SOI device. Differences shown in the second embodiment of the present invention are described below.

In the second embodiment shown in FIG. 4, the surface silicon layer 100c surrounded by the insulating layer 100b and element isolating layer 102 is used as a PMOS transistor channel region, the P+ type of the first diffusion region 134 and N well 104 are made into a P/N diode, and the N type of the second diffusion region 128 and the P type semiconductor substrate 100a are made into an N/P diode.

Furthermore, as described in the first embodiment of the present invention, a P well and/or a P type impurity doping region may be additionally constructed in the SOI device.

FIGS. 5a through 5k are diagrams for illustrating sequential fabrication of the SOI device in accordance with the second preferred embodiment of the present invention. With reference to the accompanying drawings, the fabricating processes will be described in detail as follows. For convenience in the descriptions, the processes identical to the first embodiment of the present invention will be briefly described, and their differences will be described in more detail.

Figure 5A:
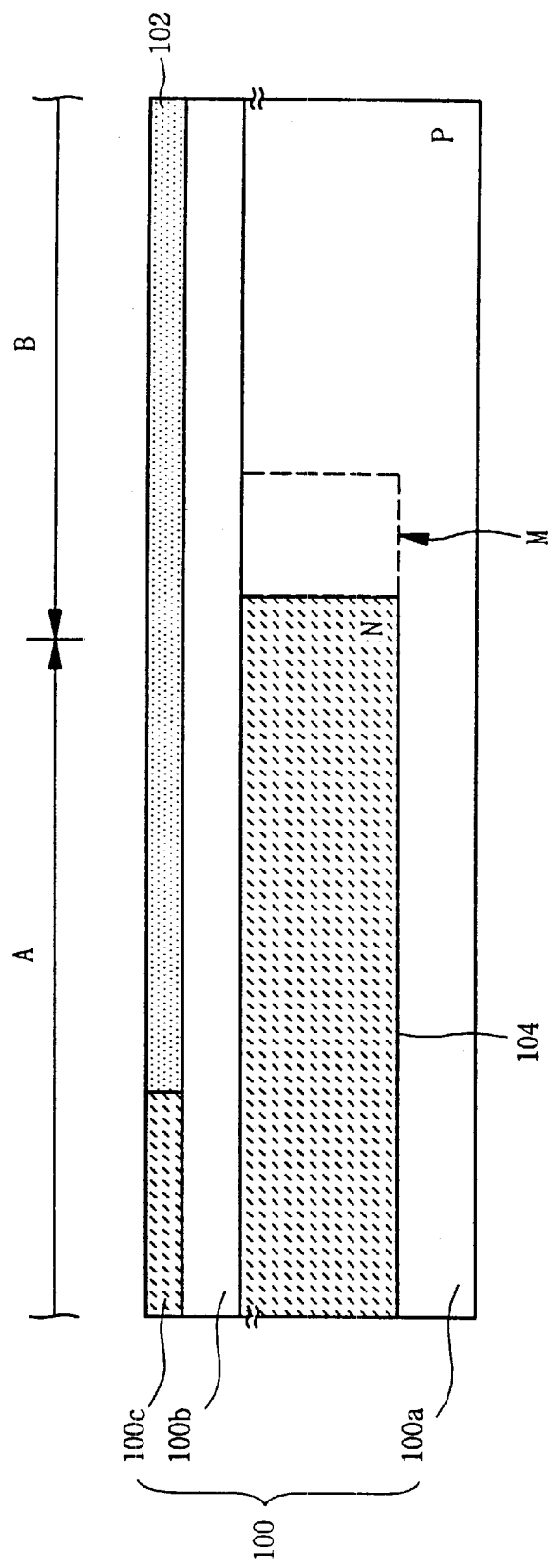

As shown in FIG. 5a, a SOI substrate 100 is sequentially formed with an insulating layer 100b on a P type semiconductor substrate 100a and, then, a P type surface silicon layer 100c on the insulating layer 100b. Then, a trench isolation process or LOCOS process is performed to form an element isolating layer 102 in a predetermined part of the surface silicon layer 100c. Accordingly, an N type of impurity is selectively ion-implanted only to a PMOS transistor forming part (A) to dope a part of the surface silicon layer 100c and, at the same time, to form an N well 104 in the semiconductor substrate 100a under the surface silicon layer 100c.

At this time, after formation of the N well 104, the ion-implantation process can also be additionally performed for forming a P well in the semiconductor substrate 100a of the NMOS transistor forming part (B). After formation of the additional P well, a field ion-implantation process is additionally performed for forming a P type impurity doping region contacting the N well 104 at a part designated by reference symbol M. If necessary, a field ion-implantation process is performed immediately after formation of the N well 104 to form the P type impurity doping region (not shown) instead of the P well.

Figure 5B:
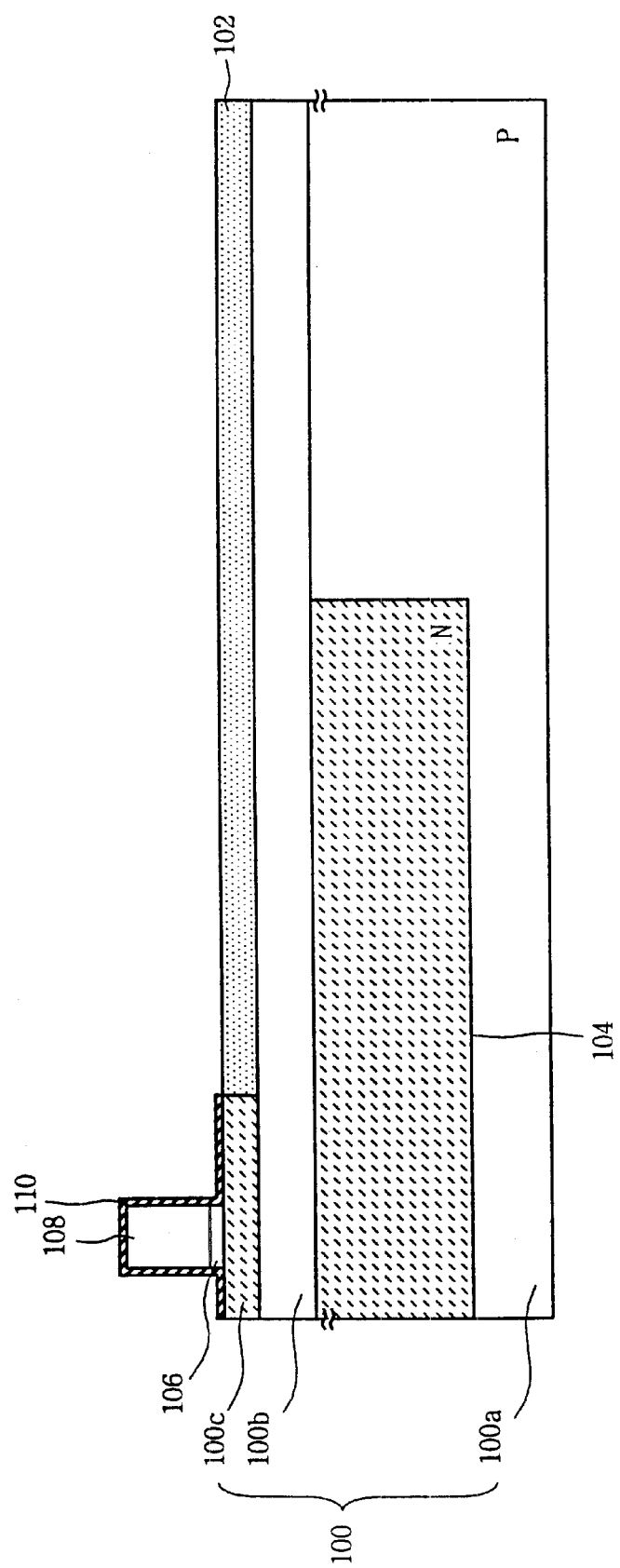

As shown in FIG. 5b, a gate insulating layer 106 is inserted on the surface silicon layer 100c surrounded by element isolating layer 102 and insulating layer 100b to form a polysilicon gate electrode 108. A thermal oxidation process is performed over the surface silicon layer 100c including the surface exposing part of the gate electrode for forming a thin first oxide layer 110.

Figure 5C:
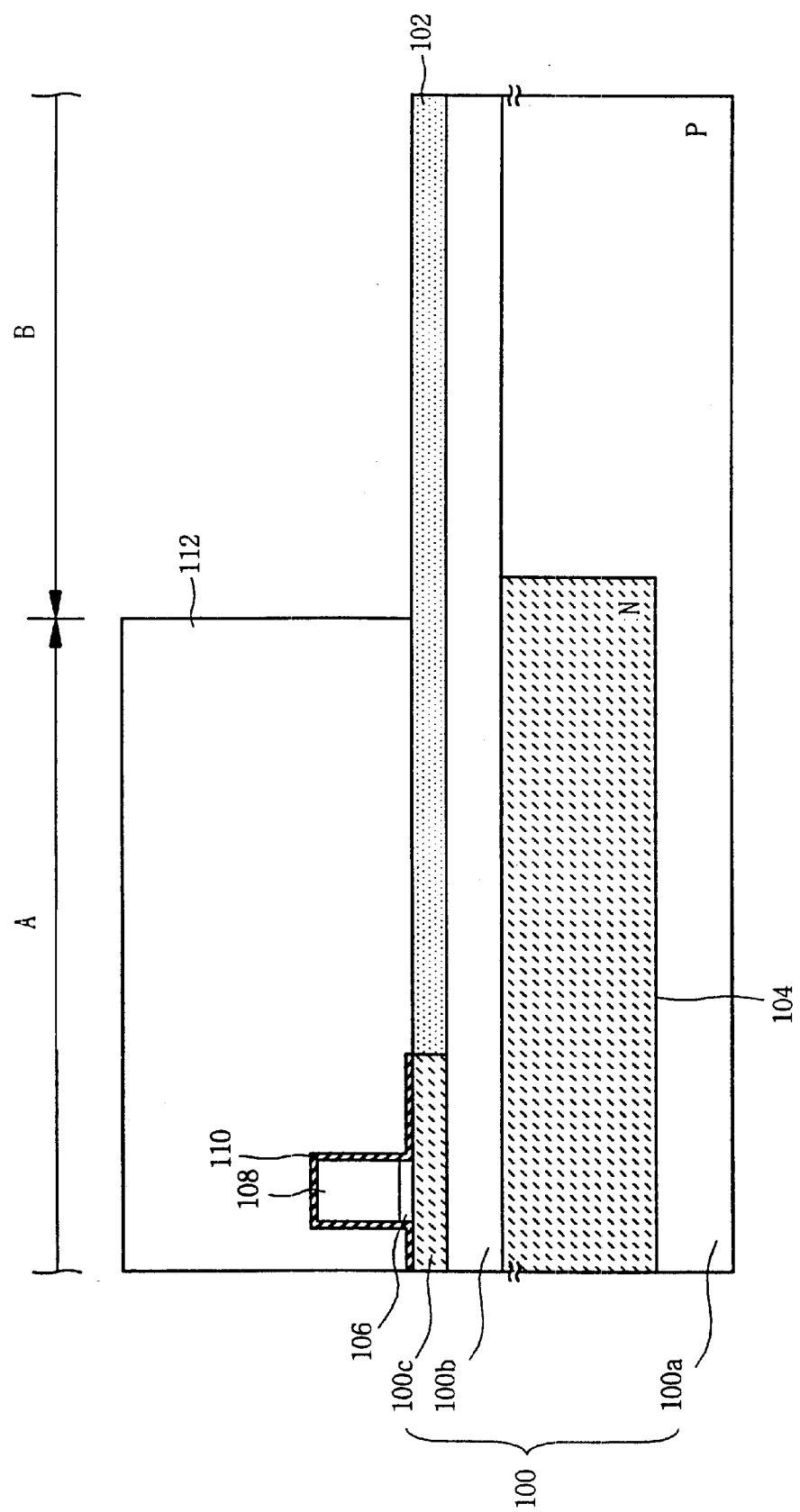

As shown in FIG. 5c, a first photo resist layer pattern 112 is formed at the PMOS transistor forming part (A) of the resultant structure, and used as a mask for ion-implanting a low density of N type impurity to the substrate. As a result, in both edges of the surface silicon layer of the gate electrode (not shown) positioned at an NMOS transistor forming part (B) an LDD region (not shown) is formed with its bottom portion contacting the insulating layer 100b.

Figure 5D:
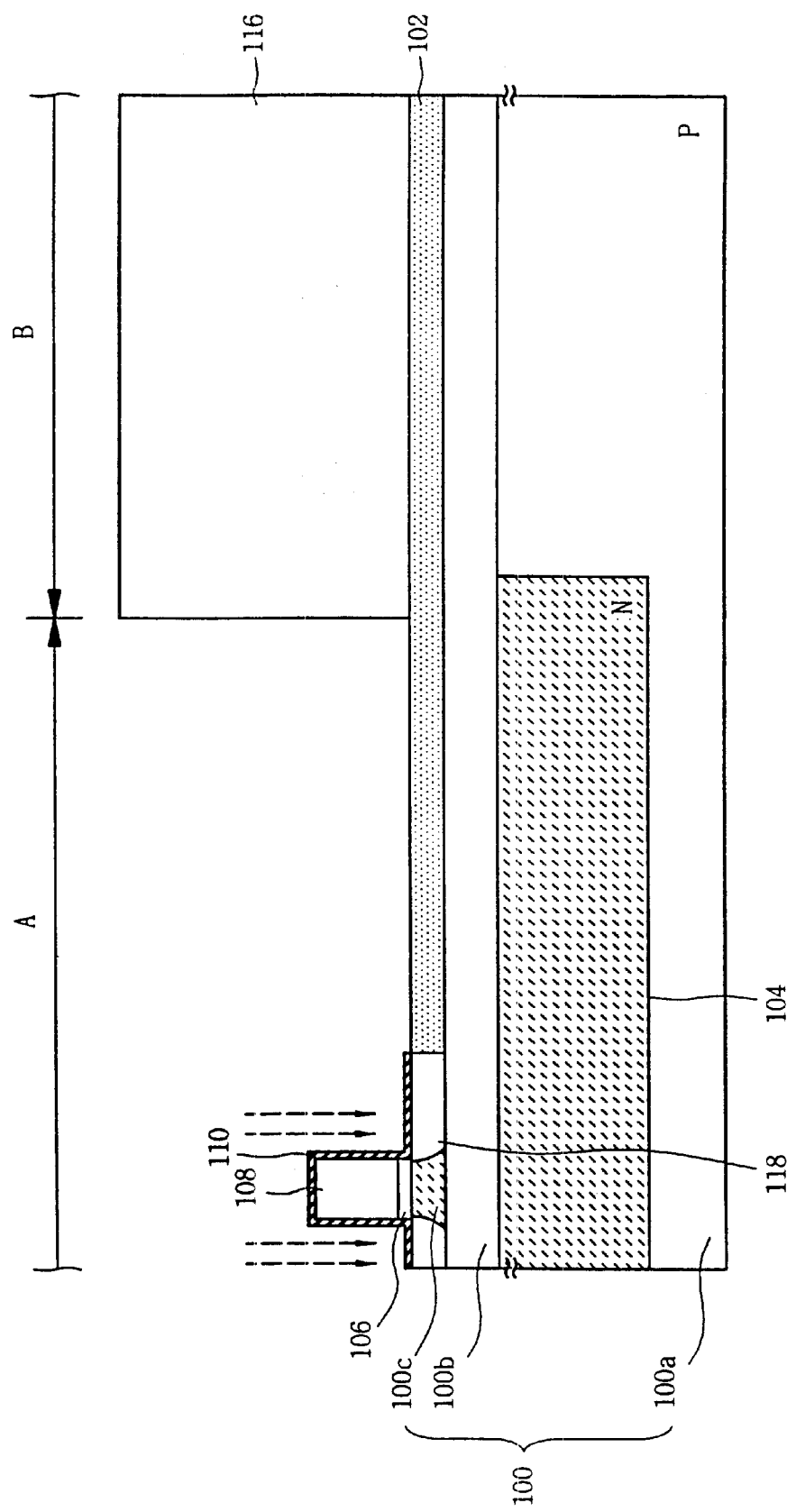

As shown in FIG. 5d, after removal of the first photo resist layer pattern 112, a second photo resist layer pattern 116 is formed at the NMOS transistor forming part (B) of the resultant structure, and used as a mask for ion-implanting a low density of P type impurity to the substrate. As a result, in both edges of the surface silicon layer 100c of the gate electrode 108 positioned at the PMOS transistor forming part (A) an LDD region 118 is formed with the bottom portion contacting the insulating layer 100b.

Figure 5E:
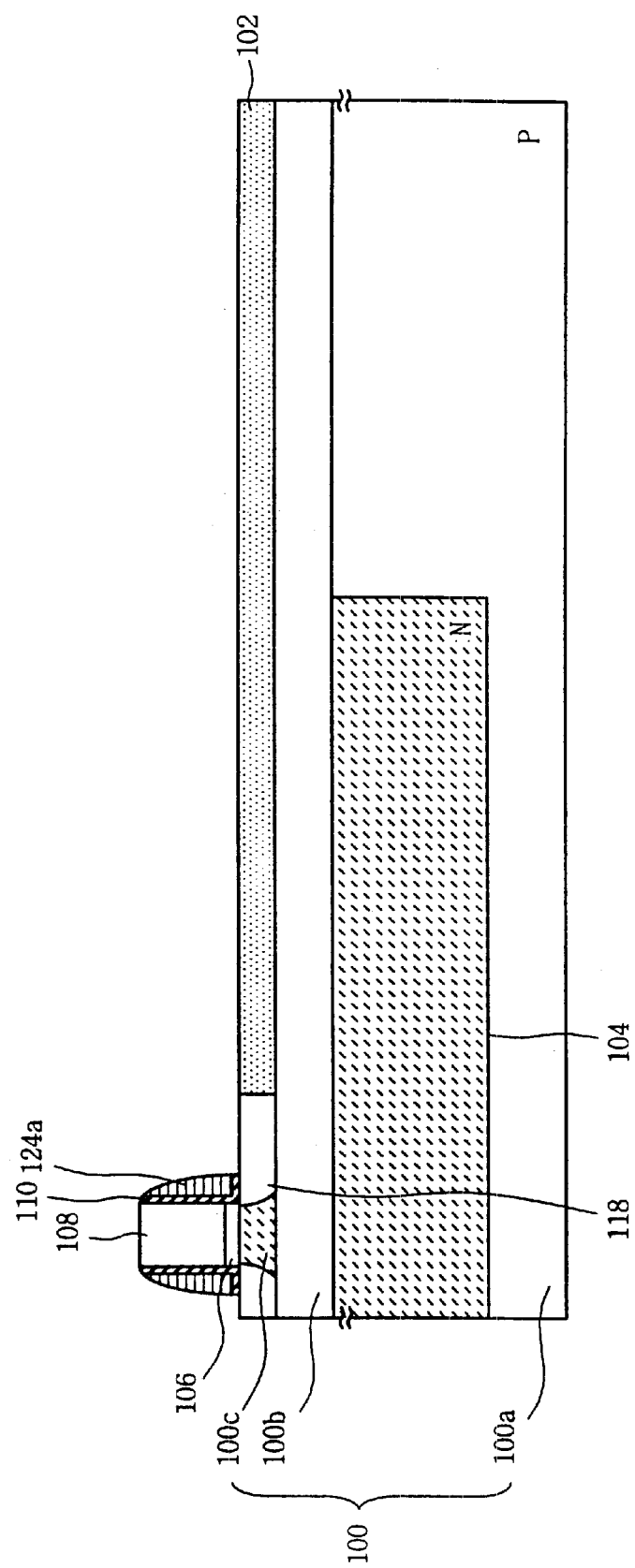

As shown in FIG. 5e, after removal of the second photo resist layer pattern 116, an insulating layer is formed over the resultant structure, and a bi-directional dry etching process is performed to the insulating layer to form first insulating spacers 124a at both lateral walls of the gate electrode 108. In this process, a part of the first oxide layer 110 is also etched out to thereby expose the upper surface of the gate electrode 108. At this time, the insulating layer can be made in a single structure of an oxide or nitride layer, or in a deposition structure of oxide and nitride layers.

Figure 5F:
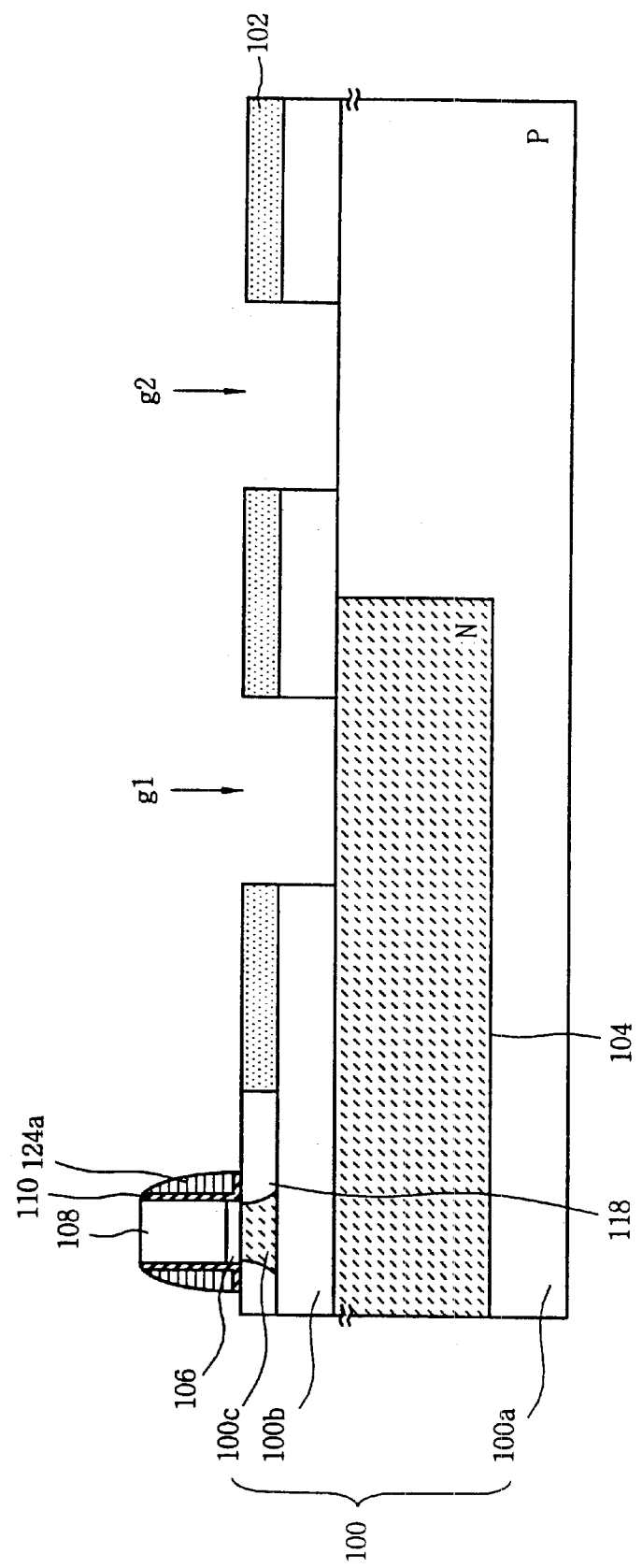

As shown in FIG. 5f, a mask pattern restricting a diode forming part is used for selectively etching the surface silicon layer 100c and the insulating layer 100b to respectively expose predetermined portions of the N well 104 and the semiconductor substrate 100a. As a result, a first groove (g1) is formed at one side of the gate electrode 108 with the element isolating layer 102 being positioned therebetween to expose a predetermined portion of the N well, and a second groove (g2) at the one side of the first groove (g1) with the element isolating layer 102 being positioned therebetween to expose a predetermined portion of the semiconductor substrate 100a.

As shown in FIG. 5g, a third photo resist layer pattern 126 is formed on the PMOS transistor forming part (A) of the resultant structure and used as a mask for ion-implanting a high density of the N type impurity to the substrate. An LLD structure of a source/drain region (not shown) is formed in the surface silicon layer at both edges of the gate electrode (not shown) of the NMOS transistor forming part (B), and an N+ layer 128, a high density of an N type impurity layer, is formed in the semiconductor substrate 100a under the second groove (g2), thereby completing formation of a second diffusion region.

Figure 5H:
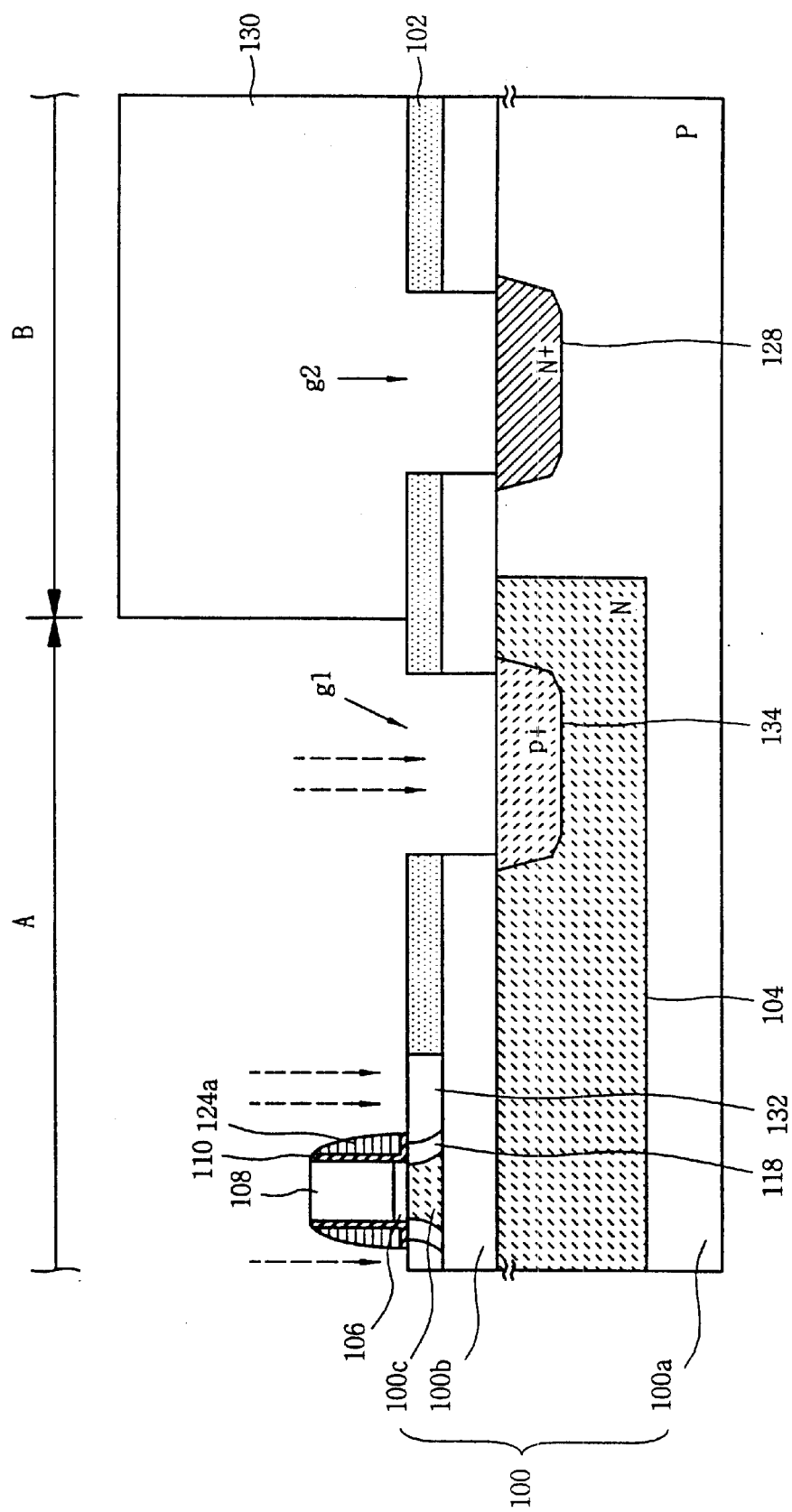

As shown in FIG. 5h, after removal of the third photo resist pattern 126, a fourth photo resist layer pattern 130 is formed on the NMOS transistor forming part (B) of the resultant structure and used as a mask to ion-implant a high density of the P type impurity to the substrate. As a result, an LDD structure of source/drain region 132 is formed in the surface silicon layer 100c at both edges of the gate electrode 108 placed at the PMOS transistor forming part (A), and a P+ layer 134, a high density of a P type impurity layer, is formed in the P– layer 104 under the first groove (g1), thereby completing formation of a first diffusion region.

Figure 5I:
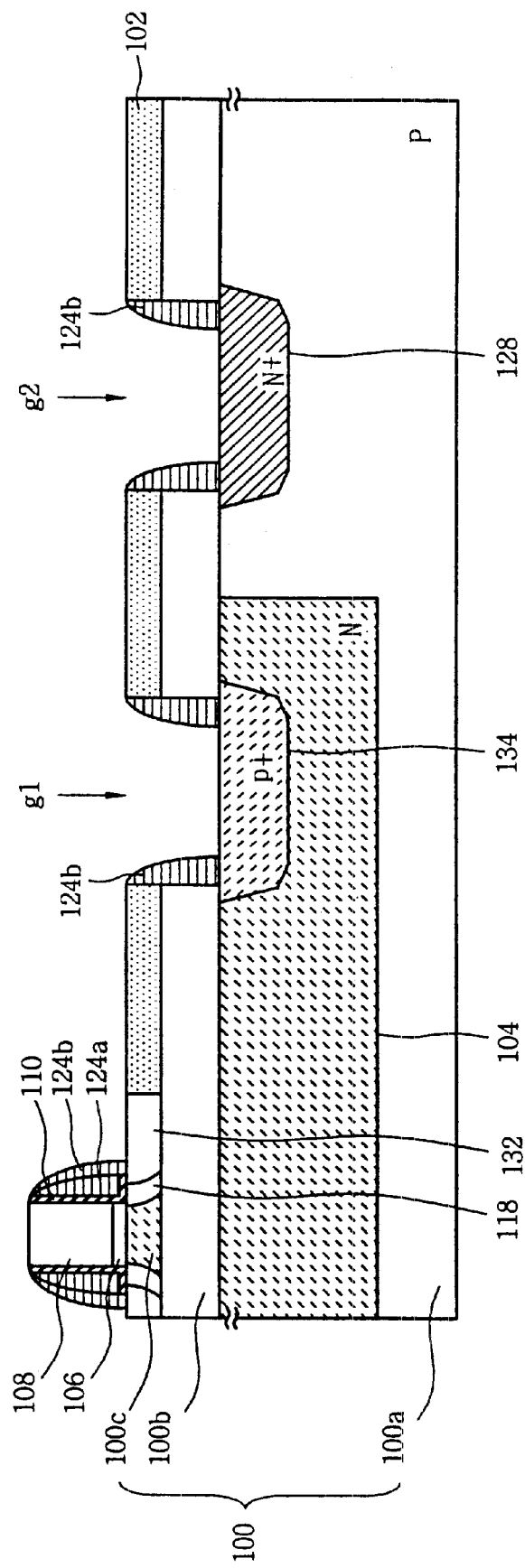

As shown in FIG. 5i, after removal of the fourth photo resist layer pattern 130, an insulating layer is formed over the resultant structure, and a bi-directional dry etching process is performed to the insulating layer to form second spacers 124b of an insulating material at an external surface of the first spacer 124a and both lateral walls of the first and second grooves (g1, g2). As a result, a double structure of spacers is formed at both lateral walls of the gate electrode 108 while a single structure of spacers is formed at both lateral walls of the first and second grooves (g1, g2).

Figure 5J:
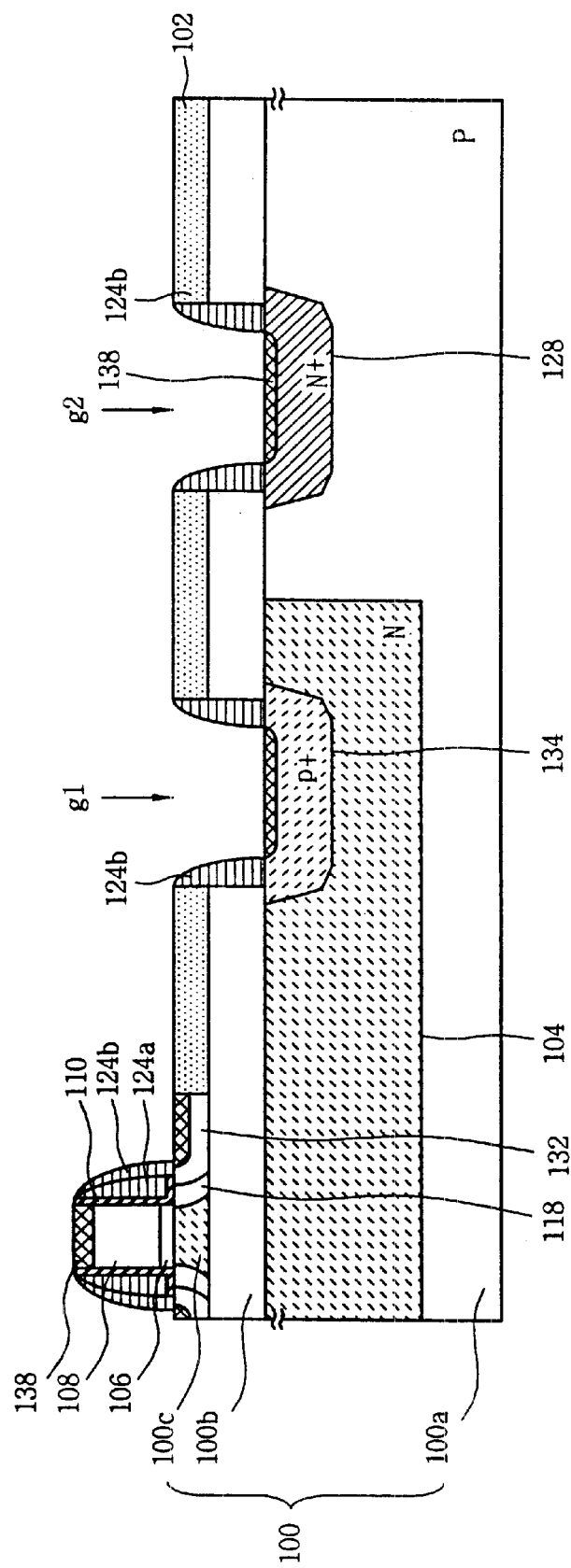

As shown in FIG. 5j, silicide layers 138 are self-aligned onto the gate electrode 108, the source/drain region 132, the P+ layer (the first diffusion region) 134 and the N+ layer (the second diffusion region) 128 under the first and second grooves (g1, g2).

As shown in FIG. 5k, an insulating layer 140 is formed over the resultant structure with a plurality of contact holes to respectively expose the silicide layers 138 of the P+ and N+ layers 134, 128. Then, a plurality of contact wires 142 are installed in the insulating layer 140 for separately connecting the first and second diffusion regions, thereby completing all the fabricating processes of the SOI device in accordance with the second embodiment of the present invention. The contact wires 142 may comprise, for example, Al or Cu alloy.

If the SOI device is fabricated in the structure shown in FIG. 4 according to the aforementioned fabricating processes, the parts to form the silicide layers 138 at the first and second diffusion regions (P+ and N+ layers respectively designated by reference numerals 134 and 128) are restricted to a range of space between spacers 124b with spacers 124 being formed at both lateral walls of the first and second grooves (g1, g2), thereby making it possible to respectively secure a length (l2) between the silicide layer 138 and each of the diffusion regions (b, a), greater than that in the prior art, at the both edges of the upper ends of diffusion regions (b, a) (the parts designated by reference symbols II). As a result, the SOI device thus constructed confers numerous advantages in minimizing power leakage at both lateral sides of the first and second diffusion regions (b, a) and in preventing reduction of a backward diode characteristic.

While the fabrication techniques have been described above in relation to formation of diodes in accordance with the preferred embodiments of the present invention, these techniques can also be applied to fabricate other elements, such as a well-structured resistors.

As described above, there are advantages in the SOI structure of the present invention in that the parts to form silicide layers in diffusion regions to be used for diode or well resistors can be restricted with spacers to a predetermined range of space to thereby make it possible to respectively secure a length (l1 and l2 designated in FIGS. 2 and 4) between lateral sides of silicide layers and diffusion regions, to a greater degree than that of the prior art, minimize power leakage at sides of the diffusion regions and improve functional characteristics of the semiconductor device.

While this invention has been particularly shown and described with reference to preferred embodiments thereof, it will be understood by those skilled in the art that various changes in form and detail may be made herein without departing from the spirit and scope of the invention as defined by the appended claims.

What is claimed is:

1. A method for fabricating a SOI semiconductor device comprising the steps of:

forming a surface silicon layer on an insulating layer formed on a semiconductor substrate;

forming an element isolating layer at predetermined portions of the surface silicon layer;

forming a groove by sequentially etching the element isolating layer and the insulating layer of the surface silicon layer to expose a predetermined portion of the semiconductor substrate;

forming a low density impurity layer in the substrate under the groove;

forming groove spacers at lateral walls of the groove;

forming a double junction structure of the diode diffusion region where a high density impurity layer is formed in the low density impurity layer under the groove; and forming a self-aligned silicide layer on the diode diffusion region between the spacers.

2. The method, as defined in claim 1, wherein the groove spacers are formed at the same time as gate spacers of the transistor.

3. The method, as defined in claim 1, wherein the diode diffusion region is formed in the well of the semiconductor substrate.

4. A method for fabricating a SOI semiconductor device comprising the steps of:

forming a surface silicon layer on an insulating layer formed on a semiconductor substrate;

forming an element isolating layer at predetermined portions of the surface silicon layer;

forming a transistor on the surface silicon layer with a central gate electrode, gate spacers at lateral walls of the gate electrode, and source/drain regions formed in the surface silicon layer at both edges of the spacers;

forming a groove by sequentially etching the element isolating layer and insulating layer of the surface silicon to expose predetermined portions of the semiconductor substrate;

forming a diode diffusion region in a single junction structure of a high density impurity layer in the semiconductor substrate under the groove;

forming groove spacers at lateral walls of the groove; and forming a self-aligned silicide layer on the diode diffusion region between the groove spacers.

5. The method, as defined in claim 4, wherein the gate spacers of the transistor are formed in a double structure.

6. The method, as defined in claim 5, wherein the gate spacers positioned at the external sides of spacers and the groove spacers positioned at the lateral walls of the groove are simultaneously formed.

7. The method, as defined in claim 4, wherein the diode diffusion region is formed in the well of the semiconductor substrate.

8. A method for fabricating a SOI semiconductor device comprising the steps of:

forming a surface silicon layer on an insulating layer formed on a first conductivity type semiconductor substrate;

forming an element isolating layer at predetermined portions of the surface silicon layer;

selectively ion-implanting a second conductivity impurity on a transistor portion to dope a predetermined internal portion of the surface silicon layer with a second conductivity type of impurity, and, at the same time, forming a second conductivity type of a well in the semiconductor substrate;

forming a gate electrode by applying a gate insulating layer to the surface silicon layer doped with impurity;

forming a groove by sequentially etching the element isolating layer and insulating layer of the surface silicon layer with a mask pattern that defines a diode portion, to expose a predetermined surface portion of the second conductivity type well at one side of the gate electrode;

forming an LLD region in the surface silicon layer at both edges of the gate electrode by selectively ion-implanting a first conductivity type of a low density impurity at the transistor portion and forming a low density impurity layer in a second conductivity type of a well under the groove;

forming spacers at both lateral walls of the gate electrode and at those of the groove;

forming a source/drain region in the surface silicon layer at both edges of the gate electrode by selectively ion-implanting the first conductivity type of a high density impurity only to a transistor forming part and, then, forming a diode diffusion region constructed in a double junction structure, where the first conductivity type of a low density impurity layer surrounds the same type of a high density impurity layer, in the second conductivity type well under the groove; and forming a self-aligned silicide layer on the diode diffusion region between the surface exposed portion of the source/drain region having the gate electrode and the spacers.

9. The method, as defined in claim 8, wherein, following formation of the groove, first oxide layers are respectively formed through an oxidation process at the surface exposing part of the surface silicon layer including the gate electrode and at a second conductivity type well under the groove.

10. The method, as defined in claim 9, wherein, following ion-implantation of a first conductivity type of a low density of impurity selectively to the transistor portion, a second oxide layer is additionally formed on the first oxide layer through a layer deposition process.

11. The method, as defined in claim 10, wherein, following ion-implantation of the first conductivity type of a high density of impurity selectively to the transistor portion for additionally forming the second oxide layer on the first oxide layer, removing the oxide layer remaining at the upper surfaces of the gate electrode, the source/drain region and the diode diffusion region under the groove.

12. The method, as defined in claim 8, wherein the step of forming the spacers further comprises:

forming an insulating layer on the resultant structure having the gate electrode and the groove; and performing a bi-directional dry etching process to the insulating layer to expose the element isolating layer.

13. The method, as defined in claim 8, wherein the insulating layer is constructed in a single structure of an oxide or nitride layer or a deposition structure of an oxide and nitride layer.

14. The method, as defined in claim 8, wherein the step of forming the silicide layer further comprises steps of:

performing a thermal process to a refractory formed on the resultant structure after completion of the diode diffusion region; and removing the refractory remaining after reaction.

15. The method, as defined in claim 14, wherein the refractory is formed with a material selected from the group of materials consisting of: Co, T, and Ni.

16. A method for fabricating a SOI device comprising the steps of:

forming a surface silicon layer on an insulating layer applied to a first conductivity type semiconductor substrate;

forming an element isolating layer at a predetermined portion of the surface silicon layer;

selectively ion-implanting a second conductivity impurity on a transistor portion to dope a predetermined internal portion of the surface silicon layer with a second conductivity type of impurity and, at the same time, forming a second conductivity type of a well in the semiconductor substrate;

forming a gate electrode by inserting a gate insulating layer in the surface silicon layer doped with impurity;

forming an LLD region in the surface silicon layer at both edges of the gate electrode by selectively ion-implanting a first conductivity type of a low density impurity at the transistor portion;

forming first spacers at both lateral walls of the gate electrode;

forming a groove by sequentially etching the element isolating layer and insulating layer of the surface silicon layer with a mask pattern that defines a diode forming portion, to expose a predetermined surface portion of the second conductivity type well at one side of the gate electrode;

forming a source/drain region in the surface silicon layer at both edges of the gate electrode by selectively ion-implanting the first conductivity type of a high density impurity only at the transistor forming portion and, then, forming a single junction structure of the diode diffusion region in the second conductivity type well under the groove;

forming second spacers at external sides of the first spacers at lateral walls of the groove; and forming a self-aligned silicide layer on the diode diffusion region between the surface exposed part of the source/drain region having the gate electrode and the second spacers.

17. The method, as defined in claim 16, wherein, after formation of the gate electrode, an oxide layer is additionally formed through an oxidation process at the surface exposing part of the surface silicon layer including the gate electrode.

18. The method, as defined in claim 16, wherein the step of forming the first spacers further comprises steps of:

forming an insulating layer on the resultant structure having the gate electrode; and performing a bi-directional dry etching process to the insulating layer to expose the element isolating layer.

19. The method, as defined in claim 18 wherein the insulating layer is constructed in a single structure of an oxide or nitride layer or a deposition structure of an oxide and nitride layer.

20. The method, as defined in claim 16, wherein the step of forming the second spacers further comprises steps of:

forming an insulating layer on the resultant structure where the gate electrode having the first spacers and the groove are included; and performing a bi-directional dry etching process to the insulating layer to expose the element isolating layer.

21. The method, as defined in claim 20 wherein the insulating layer is constructed in a single structure of an oxide or nitride layer or a deposition structure of an oxide and nitride layer.

22. The method, as defined in claim 16, wherein the step of forming the silicide layer further comprises steps of:

performing a thermal process to a refractory formed on the resultant structure after completion of the second spacers region; and removing the refractory remaining after reaction.

23. The method, as defined in claim 21, wherein the refractory is selected from the group of materials consisting of: Co, Ti, and Ni.

* * * * *